United States Patent
McCarten et al.

(10) Patent No.: US 8,400,537 B2
(45) Date of Patent: Mar. 19, 2013

(54) IMAGE SENSORS HAVING GRATINGS FOR COLOR SEPARATION

(75) Inventors: John P. McCarten, Penfield, NY (US); Joseph R. Summa, Hilton, NY (US)

(73) Assignee: OmniVision Technologies, Inc., Santa Clara, CA (US)

(*) Notice: Subject to any disclaimer, the term of this patent is extended or adjusted under 35 U.S.C. 154(b) by 419 days.

(21) Appl. No.: 12/269,907

(22) Filed: Nov. 13, 2008

(65) Prior Publication Data

US 2010/0118172 A1    May 13, 2010

(51) Int. Cl.
*H04N 3/14* (2006.01)
*H04N 5/335* (2011.01)
*H04N 9/04* (2006.01)

(52) U.S. Cl. ....................................................... 348/272

(58) Field of Classification Search .......... 348/272–274, 348/276–280, 291, 292, 335, 340; 216/72; 438/69
See application file for complete search history.

(56) References Cited

U.S. PATENT DOCUMENTS

| | | | |
|---|---|---|---|
| 4,506,949 A | 3/1985 | Knop | |
| 5,164,831 A | 11/1992 | Kuchta et al. | |
| 5,493,143 A * | 2/1996 | Hokari | 257/432 |
| 6,255,640 B1 | 7/2001 | Endo et al. | 250/208.1 |
| 6,590,270 B2 * | 7/2003 | Suzuki | 257/436 |
| 7,068,432 B2 * | 6/2006 | Boettiger et al. | 359/619 |
| 7,180,112 B2 * | 2/2007 | Yokozawa | 257/294 |
| 7,259,791 B2 * | 8/2007 | Fukusho et al. | 348/340 |
| 7,294,873 B2 * | 11/2007 | Suzuki et al. | 257/225 |
| 7,903,157 B2 * | 3/2011 | Takada et al. | 348/278 |
| 7,952,624 B2 * | 5/2011 | Inokuma | 348/280 |
| 2001/0045580 A1 * | 11/2001 | Descure | 257/225 |
| 2004/0056180 A1 | 3/2004 | Yu | |
| 2005/0103983 A1 * | 5/2005 | Yamaguchi et al. | 250/214.1 |
| 2006/0027887 A1 * | 2/2006 | Boettiger et al. | 257/432 |
| 2006/0043519 A1 * | 3/2006 | Ezaki | 257/461 |
| 2006/0138500 A1 * | 6/2006 | Kim | 257/294 |
| 2006/0145223 A1 * | 7/2006 | Ryu | 257/294 |
| 2006/0284052 A1 | 12/2006 | Toshikiyo et al. | |
| 2007/0008421 A1 * | 1/2007 | Wu et al. | 348/340 |
| 2007/0014019 A1 * | 1/2007 | Mouli | 359/619 |
| 2008/0007839 A1 * | 1/2008 | Deng et al. | 359/642 |

(Continued)

FOREIGN PATENT DOCUMENTS

| EP | 1 592 067 A1 | 11/2005 |
|---|---|---|
| EP | 1 936 692 A1 | 6/2008 |

(Continued)

OTHER PUBLICATIONS

International Search Report and Written Opinion for Application No. PCT/US09/05915 dated Feb. 2, 2010, 13 pages.

(Continued)

*Primary Examiner* — Aung S Moe
*Assistant Examiner* — Chriss Yoder, III
(74) *Attorney, Agent, or Firm* — Blakely, Sokoloff, Taylor & Zafman

(57) ABSTRACT

An image sensor includes an array of pixels comprising a plurality of kernels that repeat periodically and each kernel includes n photosensitive regions for collecting charge in response to light, n is equal to or greater than 2; and a transparent layer spanning the photosensitive regions having n optical paths, at least two of which are different, wherein each optical path directs light of a predetermined spectral band into specific photosensitive regions.

20 Claims, 25 Drawing Sheets

U.S. PATENT DOCUMENTS

| | | | |
|---|---|---|---|
| 2008/0049126 A1* | 2/2008 | Ford et al. | 348/294 |
| 2008/0128843 A1* | 6/2008 | Lee | 257/432 |
| 2008/0135740 A1* | 6/2008 | Matsuda et al. | 250/226 |

FOREIGN PATENT DOCUMENTS

| | | |
|---|---|---|
| WO | WO 02/052335 A2 | 7/2002 |
| WO | WO 2008/012235 A1 | 1/2008 |
| WO | WO 2008/017490 A2 | 2/2008 |
| WO | WO 2009/128022 A1 | 10/2009 |

OTHER PUBLICATIONS

International Preliminary Report on Patentability for Application No. PCT/US09/05915 dated May 17, 2011, 7 pages.

Communication from EPO regarding deadline to amend the specification and respond to the Written Opinion for Application No. 09745158.7 dated Jul. 21, 2011, 2 pages.

* cited by examiner

IMAGE SENSORS HAVING GRATINGS FOR COLOR SEPARATION

FIELD OF THE INVENTION

The present invention generally relates to image sensors having an array of pixels subdivided into kernel of pixels, and more particularly to such image sensors having different optical paths for pixels in the kernel for improving color separation and increasing quantum efficiency.

BACKGROUND OF THE INVENTION

In general, as pixels made using CMOS processes for image sensors scale to smaller dimensions, several performance properties of the imagers using these pixels degrade. One performance property in particular, quantum efficiency (QE), degrades quickly. The loss in performance is confounded with the addition of a color-filter-array (CFA) on top of the pixel array. The purpose of the CFA is to allow for color separation of the incoming light for providing the ability to reconstruct color images. However, for a given wavelength, most of the filters are absorbing. Therefore, any given wavelength effectively sees a series of small apertures above the pixel array. As the pixel pitch shrinks, the size of this effective aperture in the CFA pattern becomes comparable to the wavelength of visible light. Light diffraction diverts light onto adjacent pixels and reduces the effective QE of the targeted color pixel. Consider FIG. 1a for example. For incoming red light, the blue and green CFA of the blue 103 and green pixels 101, 104 are effectively blocking. For a Bayer pattern 105, FIG. 1b illustrates this creates a small aperture 112 above the red pixel 102 for red light. Especially below 2 μm pixel pitches, diffraction spreads the incoming red light into the adjacent blue and green pixels since the CFA is positioned a finite distance above the active layer of the image sensor where the photons are converted to charge carriers. Diffraction corrupts the effectiveness of the CFA to separate colors, increasing color crosstalk. It also effectively reduces the QE of the red pixel.

FIG. 2 shows prior art for the cross-section of four pmos pixels through the red and green CFA of a back illuminated image sensor. This will also be used as a reference point for describing the present invention in the Detailed Description of the Invention.

Still referring to FIG. 2, there is shown a photodiode 200 where photo-generated charge carriers are collected. For readout the charge carriers are electrically transferred to a floating diffusion 205 by adjusting the voltage on a transfer gate 201. The floating diffusion signal feeds the input of the source-follow transistor 203. The low-impedance output of the source-follower 203 drives the output line 204. After readout the signal in the floating diffusion 205 is emptied into the reset drain 213 by controlling the voltage on the reset gate 202. Sidewall isolation 210 between the photodiodes directs photo-generated charge carriers into the nearest photodiode 200 reducing color crosstalk within the device layer. To reduce dark current there is a thin pinning layer 212 at the surface between the silicon and dielectric near the photodiode 200. To also reduce dark current, there is a thin n-doping layer 211 along the sidewall isolation 210. Incoming light 250 first passes through the color filter array layer 230, then an anti-reflection coating layer 222, then a spacer layer that is typically silicon dioxide 221 before reaching the active device layer 220. However, the optical stack 221, 222, and 230 can consist of more or fewer layers depending on application, and often includes a micro-lens array for the top layer. FIG. 3 provides a single pixel schematic for this non-shared pinned photodiode structure of FIG. 2.

FIG. 4 shows simulation results for QE for a prior art 1.1 μm pixel array with a Bayer pattern. The peak QE for the blue response curve 503 associated with the blue pixel 103 is 40%. The peak QE for the green response curves 501, 504 associated with the green pixels 101, 104 is 35%. The peak QE for the red response curve 502 associated with the red pixel 102 is 23%. For these simulations the thickness of the dielectric spacer 221 layer is 0.5 μm. Increasing the dielectric spacer thickness 221 degrades performance resulting in lower peak QE and increased color crosstalk.

Although the presently known and utilized image sensor is satisfactory, there is a need to address the above-described drawback.

SUMMARY OF THE INVENTION

It is an object of the present invention to improve color crosstalk between adjacent pixels and increase QE by replacing the CFA with a binary optical path grating. Effective QE can be greater than 100%.

This object is achieved by adjusting optical path differences for each pixel in a color kernel such that for a specific wavelength the light intensity falling onto the image sensor interferes constructively near the surface of one pixel and destructively for the other pixels within the color kernel. For another specific wavelength, light interferes constructively near the surface of a second pixel and destructively for the other pixels within the color kernel.

These and other objects, features, and advantages of the present invention will become apparent to those skilled in the art upon a reading of the following detailed description when taken in conjunction with the drawings wherein there is shown and described an illustrative embodiment of the invention.

ADVANTAGEOUS EFFECT OF THE INVENTION

The present invention has the advantage of improving color crosstalk between adjacent pixels and increasing QE.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

An optical path as defined herein is:

$$\text{optical path} = n \times d, \quad \text{(Eq. 1)}$$

where n is the index of refraction and d is the thickness of the material through which the light is passing.

Figure 7:
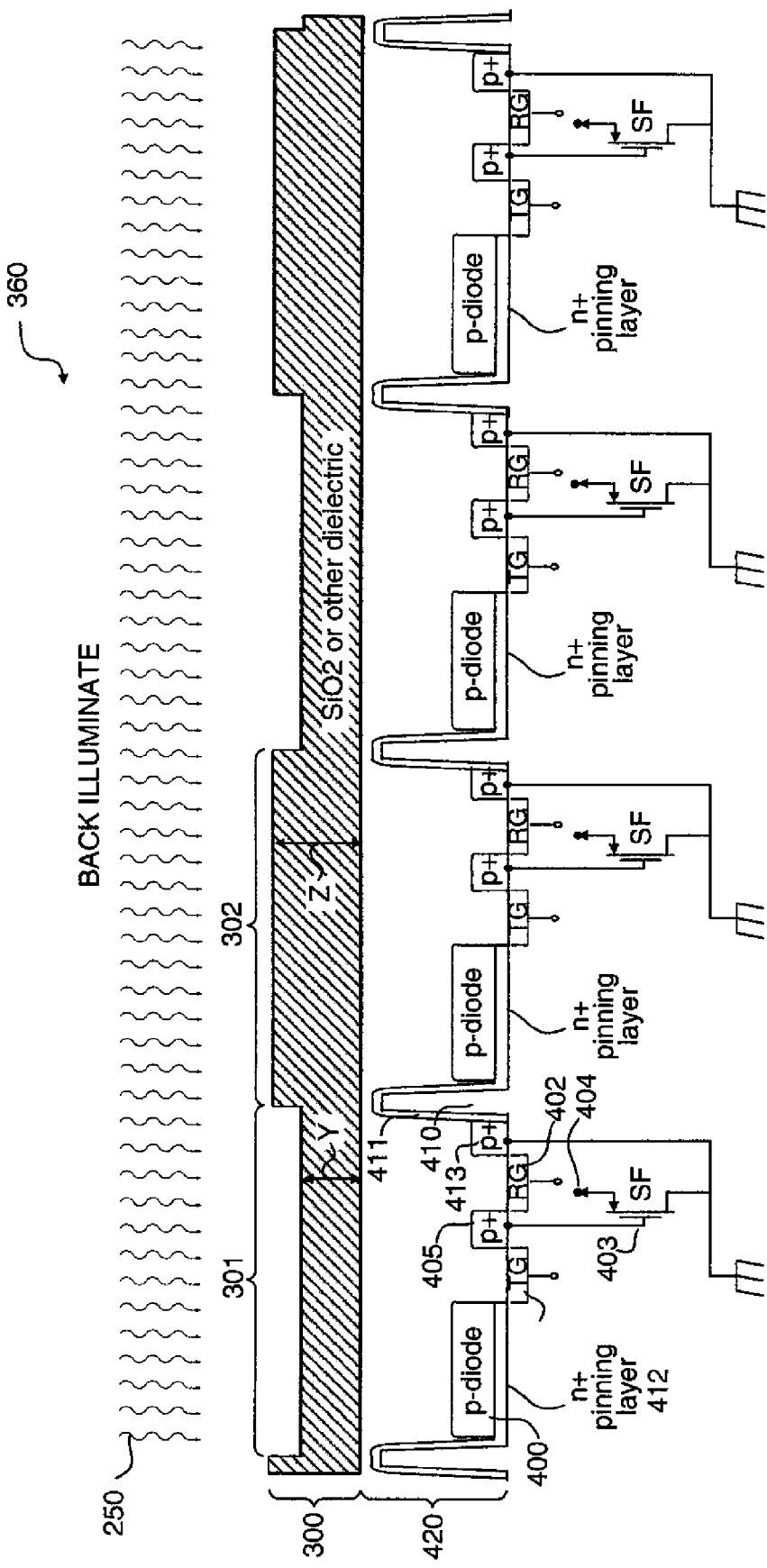
FIG. 7 shows a cross-section of four pixels of a backside illuminated image sensor cut through the red and green portion of the color kernel of the optical path grating (Y and Z)

Turning now to FIG. 7, there is shown a portion of an image sensor array 401 of an image sensor of the first embodiment of the present invention. It is noted that, although the cross section only shows four pixels for simplicity, the image sensor array 401 typically includes thousands or millions of pixels. It is further noted that the image sensor array 401 is typically a part of an active pixel sensor as will be discussed in FIG. 19. Referring back to FIG. 7, the image sensor array 401 includes a plurality of pixels 301 and 302 disposed in an active layer 420. The pixels 301 and 302 are preferably grouped together in a 2×2 array, hereinafter a color kernel, that repeats over the array as will be described in detail hereinbelow. Although a 2×2 array is preferred, other color kernel sizes may also be used. Each pixel 301 and 302 includes a charge collection region, preferably a pinned photodiode 400, disposed slightly away from the surface of the active layer that receives the incident light 250. The configuration of polysilicon gates 401, 402, 403, and metal wires 404 opposite the illuminated side of the active layer 420 is called backside illumination. The pinned photodiode 400 collects charge in response to the incident light. The pinned photodiode 400 includes a pinning layer 412 beneath a doped region of opposite conductivity type disposed thereon. Although a pinned photodiode 400 and backside illumination are used for the preferred embodiment, a photodiode may also be used as the charge collection region and front illumination be used as charge collection region, both of which are well known and will not be discussed herein.

When activated, a transfer gate 401 passes charge from the pinned photodiode 400 to a charge-to-voltage conversion region 405, preferably a floating diffusion, which converts charge to a voltage signal. An amplifier or buffer 403, preferably a source follower amplifier, passes the voltage onto an output line for further processing. A reset gate 402 is activated for resetting the floating diffusion 405 to a predetermined signal level.

A transparent grating layer 300 with a varying thickness is disposed spanning the pixels 301 and 302 (and the pixels not shown in the drawing) for directing the incident light 250 into the active layer 420 as will be described in detail hereinbelow. The transparent layer may be made of either silicon dioxide, silicon nitride or a transparent organic material.

Figure 1B:
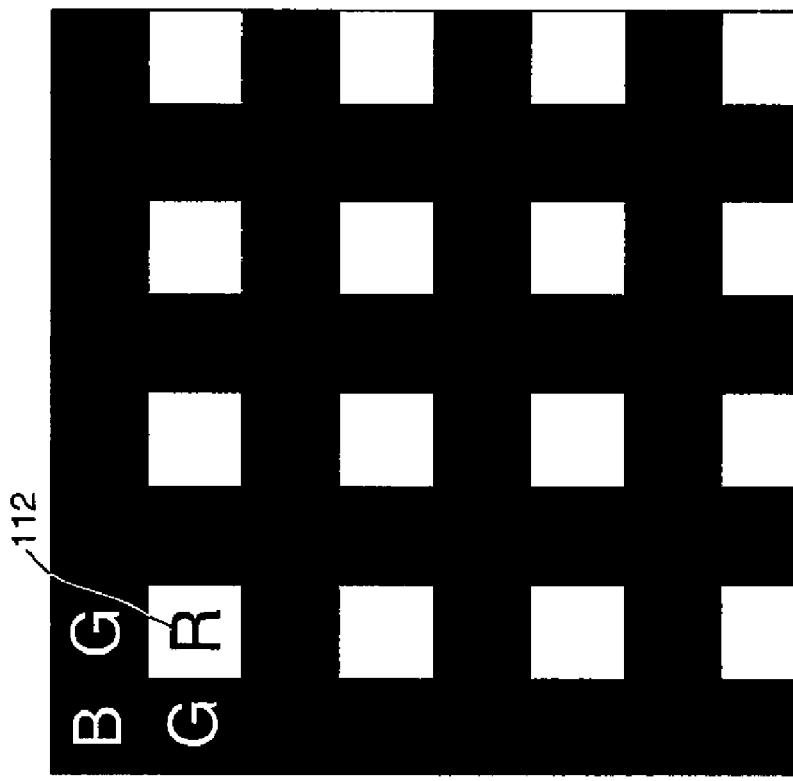
FIGS. 1a-1b show prior art of a Bayer color filter pattern.
Figure 1A:
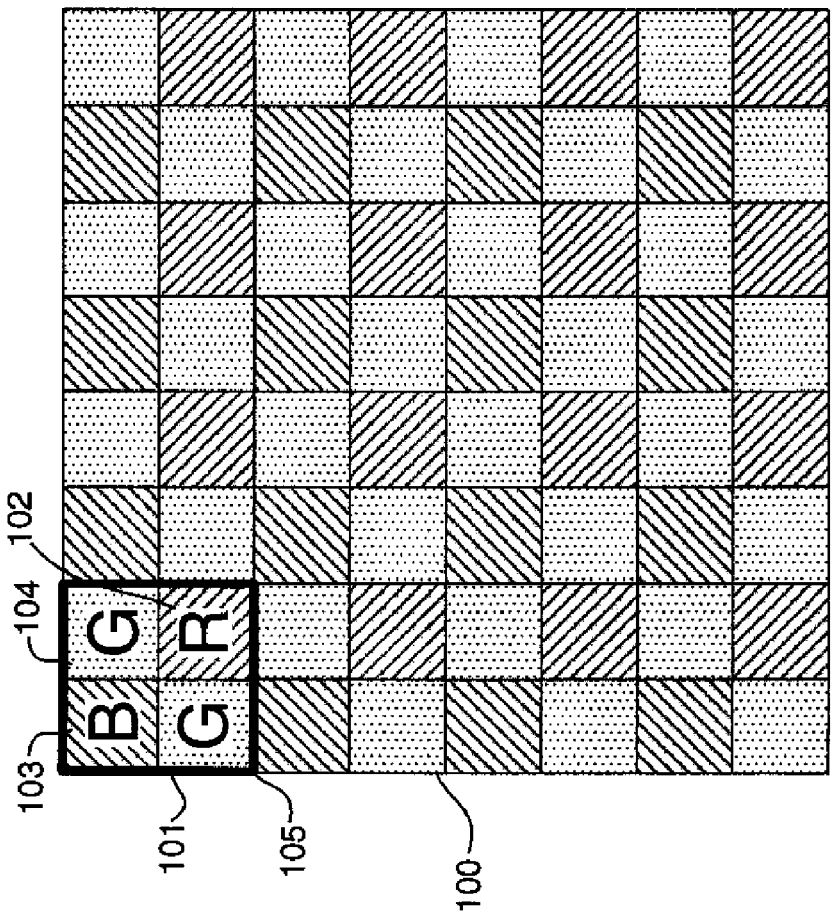
Figure 2:
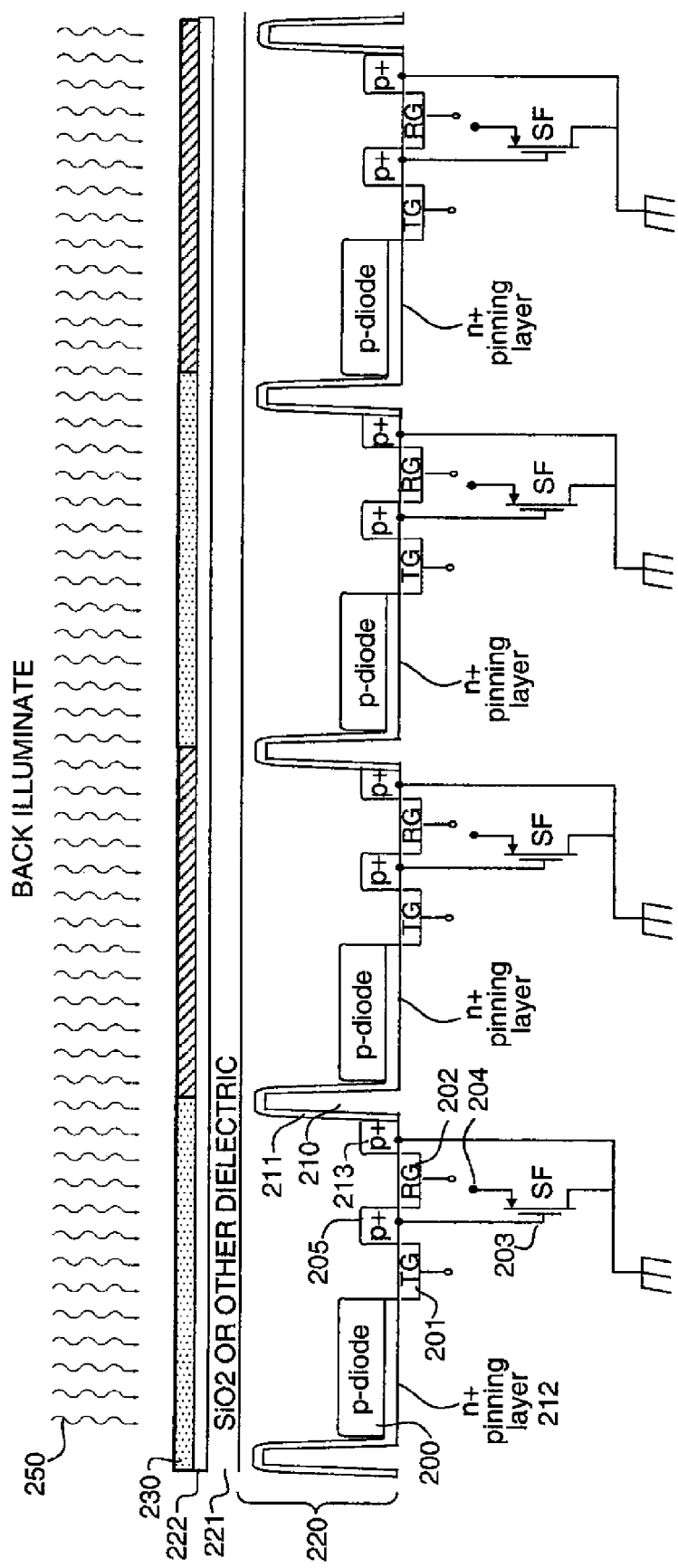
FIG. 2 shows prior art of a cross-section of four pixels of a backside illuminated image sensor cut through the red and green portion of the Bayer CFA pattern. Pixel circuitry is for a pmos image sensor.
Figure 3:
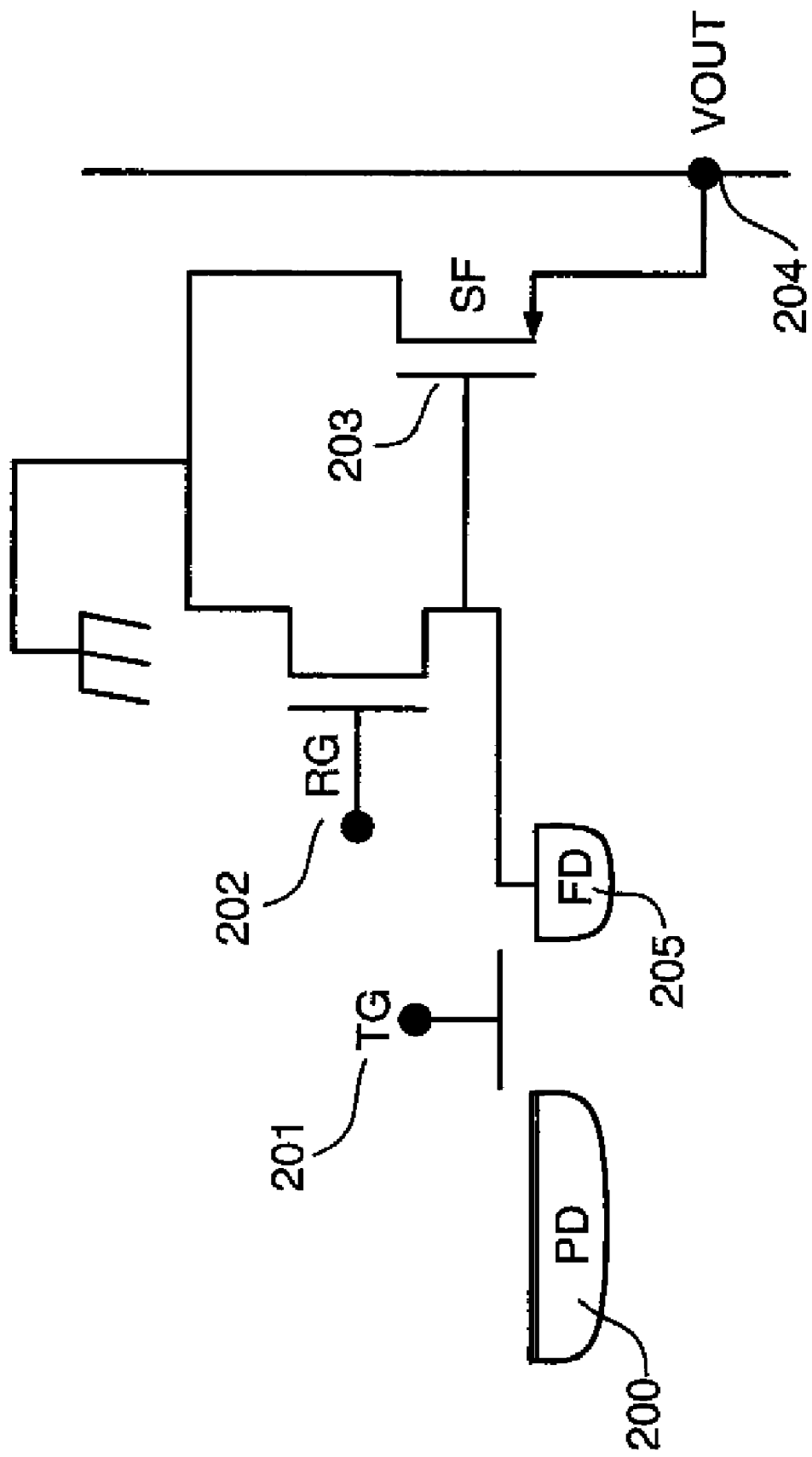
FIG. 3 shows prior art of a pmos non-shared pixel schematic.
Figure 4:
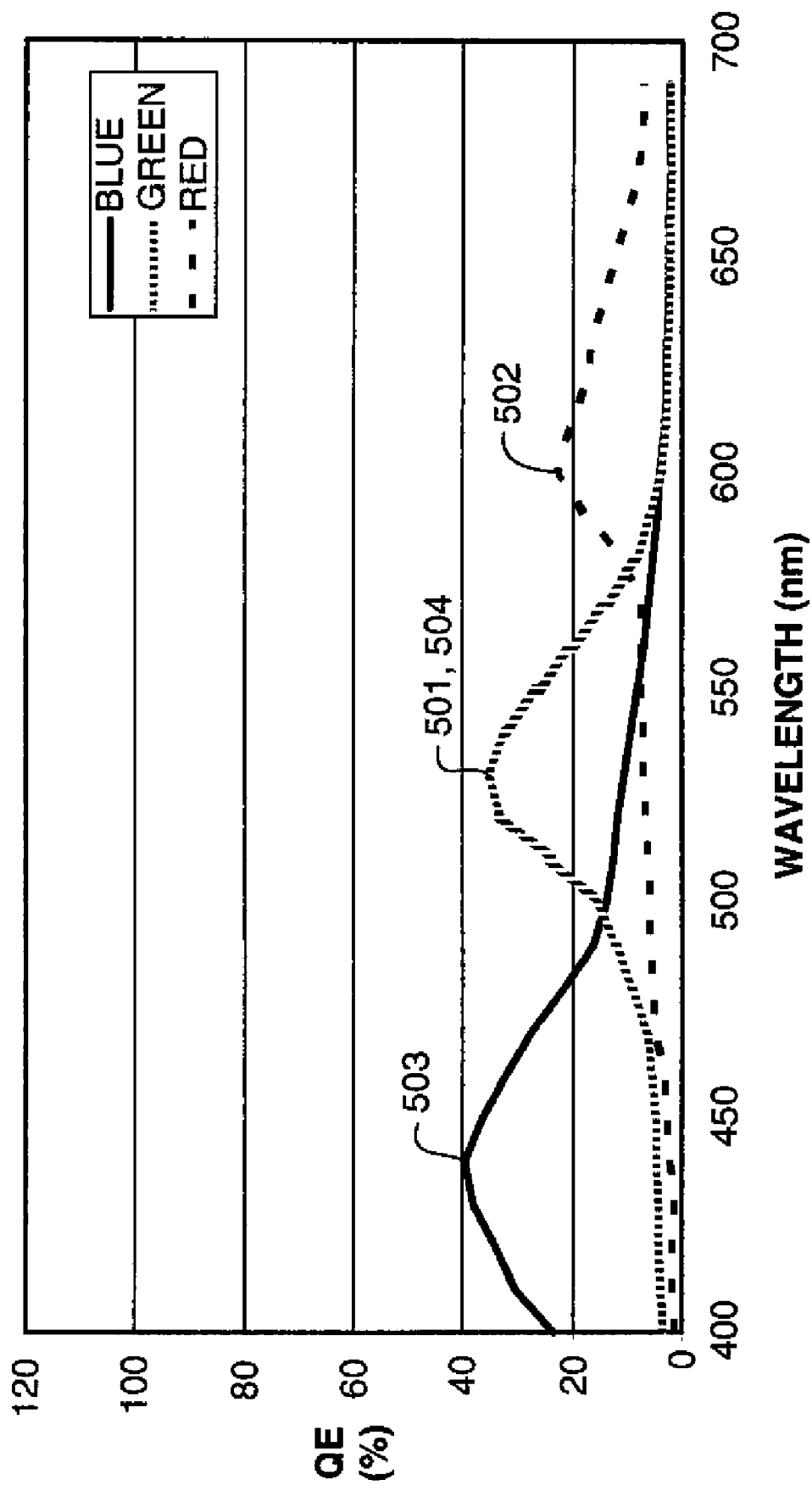
FIG. 4 is a plot of wavelength versus QE of a Bayer color filter array.
Figure 5:
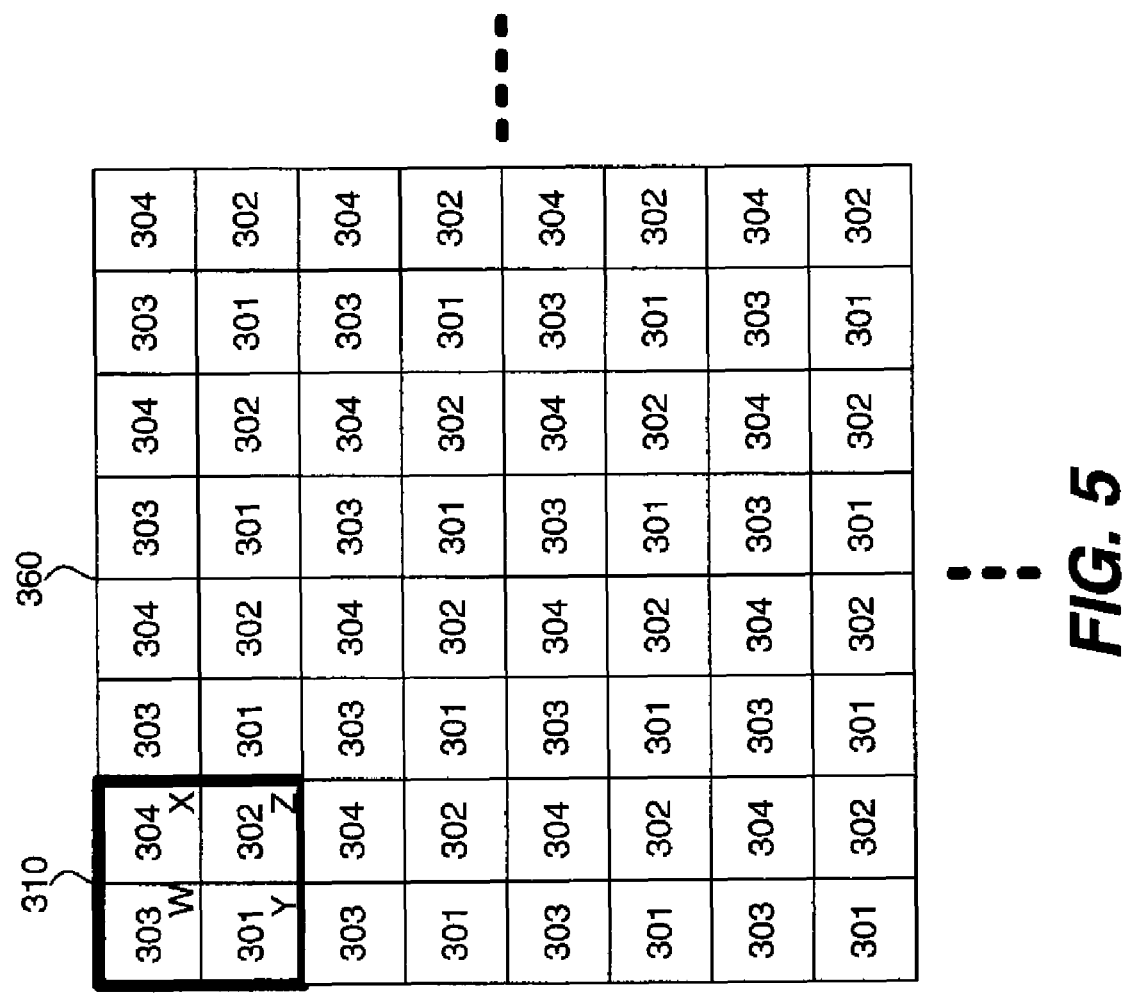
FIG. 5 illustrates the first embodiment of this invention. The plan view shows a pixel array with an optical path grating. W, X, Y, and Z represent different thickness of the transparent layer above each pixel within the color kernel.

Referring to the plan view of the image sensor array 401 (commonly referred to as pixel array) in FIG. 5, there is shown the 2×2 color kernel 310 having the transparent layer overlaid thereon. The thickness of the transparent layer 300 (see FIG. 7) over each pixel 301, 302, 303, and 304 (see FIGS. 5 and 6 for all four pixels) in the color kernel 310 is different (Y, Z, W, and X). This creates four optical paths. Although the present invention in its preferred embodiment uses thickness to create the different optical paths, materials having different index of refractions may be used to create the different optical paths. In the example, the thickness of the silicon dioxide transparent layer 300 for Y, Z, W, and X are 2.5 μm, 3.0 μm, 1.5 μm, and 2.0 μm, respectively. Consequently, there are four optical paths created. Blue light constructively interferes just above pixel 303 and is effectively directed into this pixel. Likewise, green-blue light is directed into pixel 301, green-red light is directed into pixel 304, and red light is directed into pixel 302. It is noted that the repeating pattern of the transparent layer 300 is repeated for each kernel of pixels.

Figure 6:
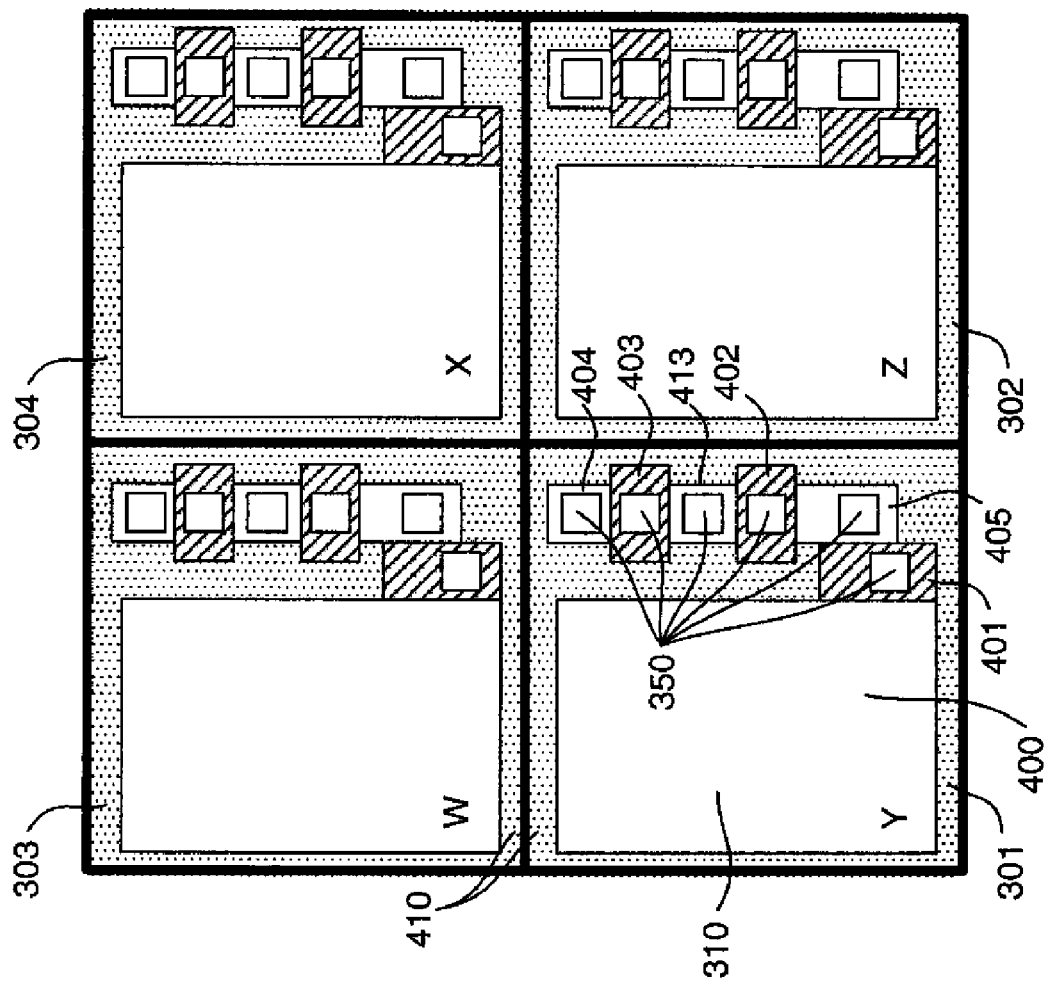
FIG. 6 shows a plan view of the color kernel with the optical path grating (W, X, Y, and Z), and more detail of the pixel device structure.

FIG. 6 shows a more detailed plan view of the four pixels 301, 302, 303, and 304 within a color kernel 310 and the device components buried beneath the imager surface. These components include the photodiode 400, transfer gate 401, reset gate 402, source-follower 403, source-follower output 404, floating-diffusion 405, sidewall isolation 410, reset drain 413, and contacts 350 from the metal lines (not shown) to the gates 401, 402, 403, and source/drain implant regions 405, 413, 404. These device components are also illustrated in the cross-section of FIG. 7. The optical stack is simply a transparent layer 300. Through this cross-section in FIG. 7 there are only two heights Y and Z.

Figure 8:
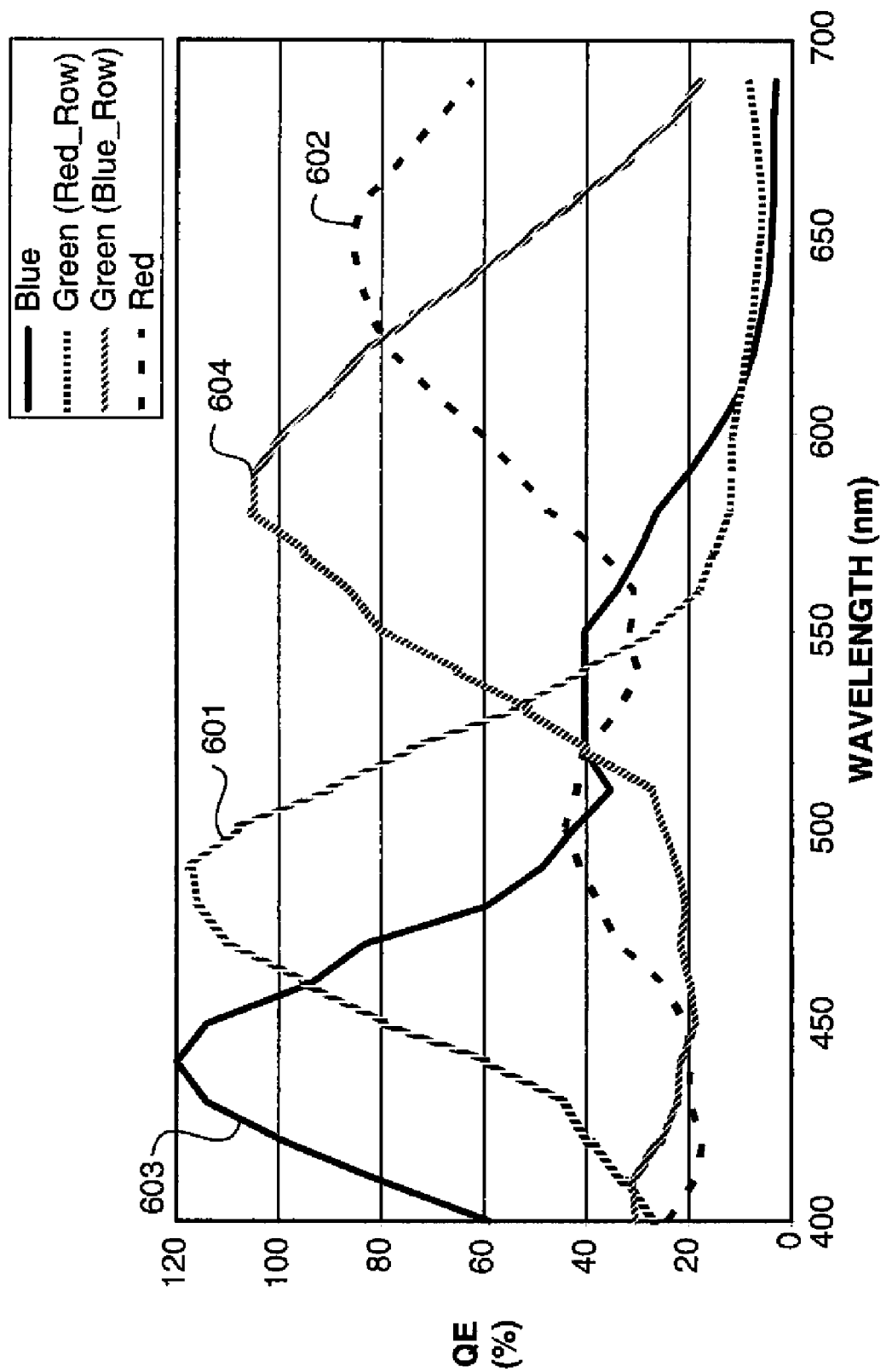
FIG. 8 is a simulated plot of QE versus wavelength for each pixel in the color kernel of FIG. 4 for 1.1 μm pixel.
Figure 9A:
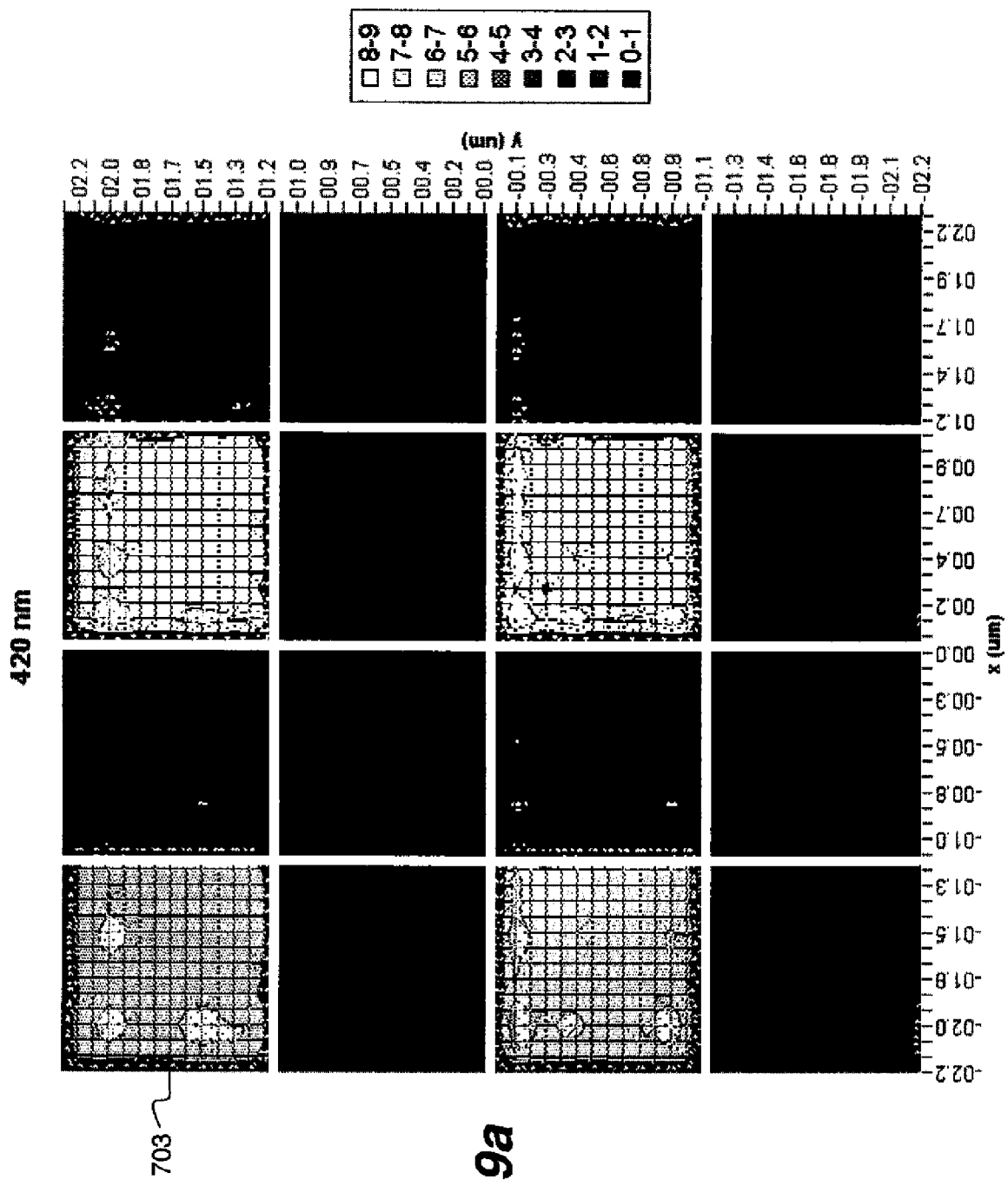
FIGS. 9a-9d illustrate how constructive and destructive interference is used to improve color crosstalk and result in QE values for a given pixel at a given wavelength of greater than 100%. Shown are intensity plots of light just above the silicon surface for four different wavelengths for the color kernel of FIG. 4. The plots are plan view and the light normal incident. For the four plots the wavelengths are 420 nm, 470 nm, 590 nm, and 650 nm.
Figure 9B:
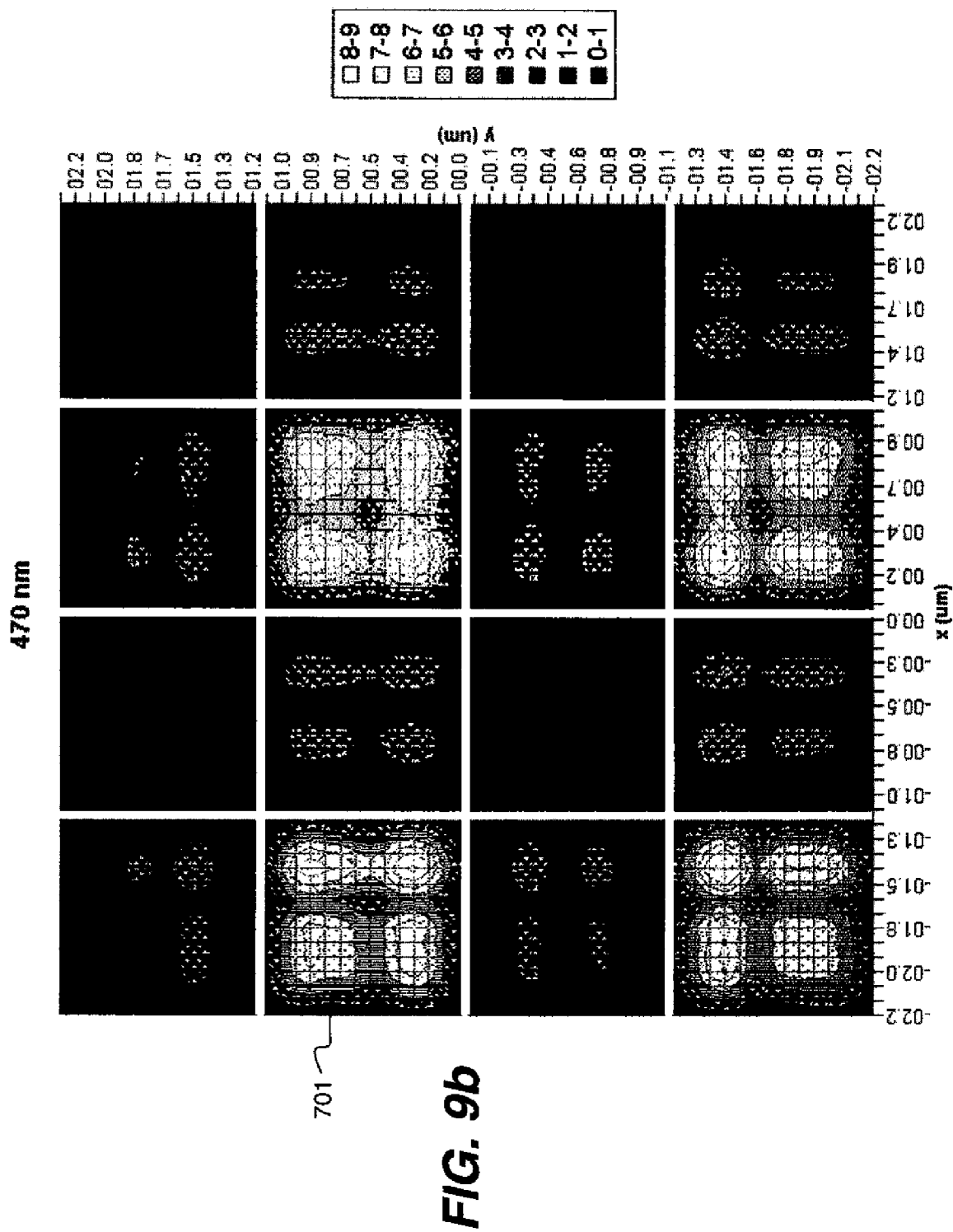
Figure 9C:
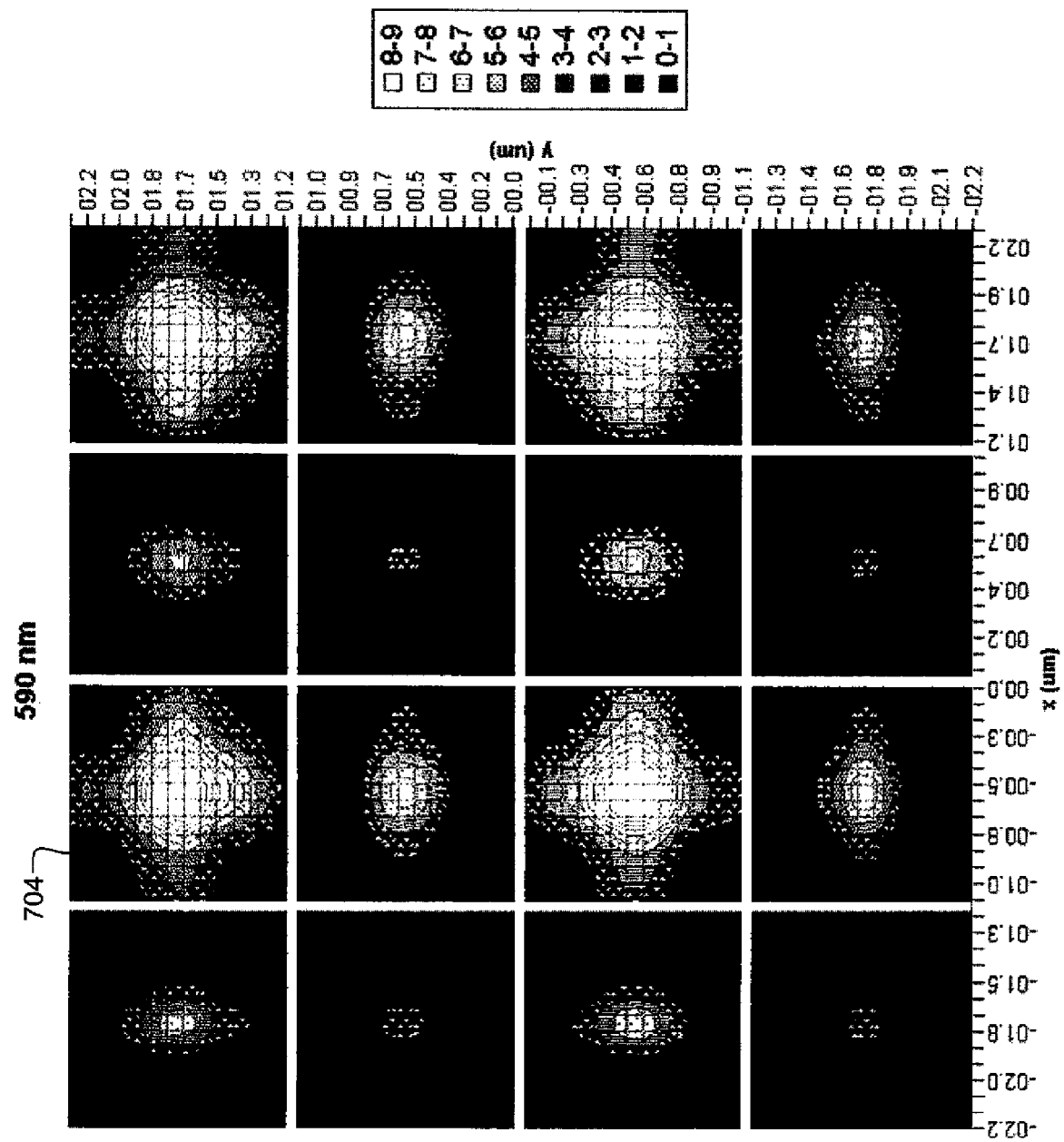
Figure 9D:
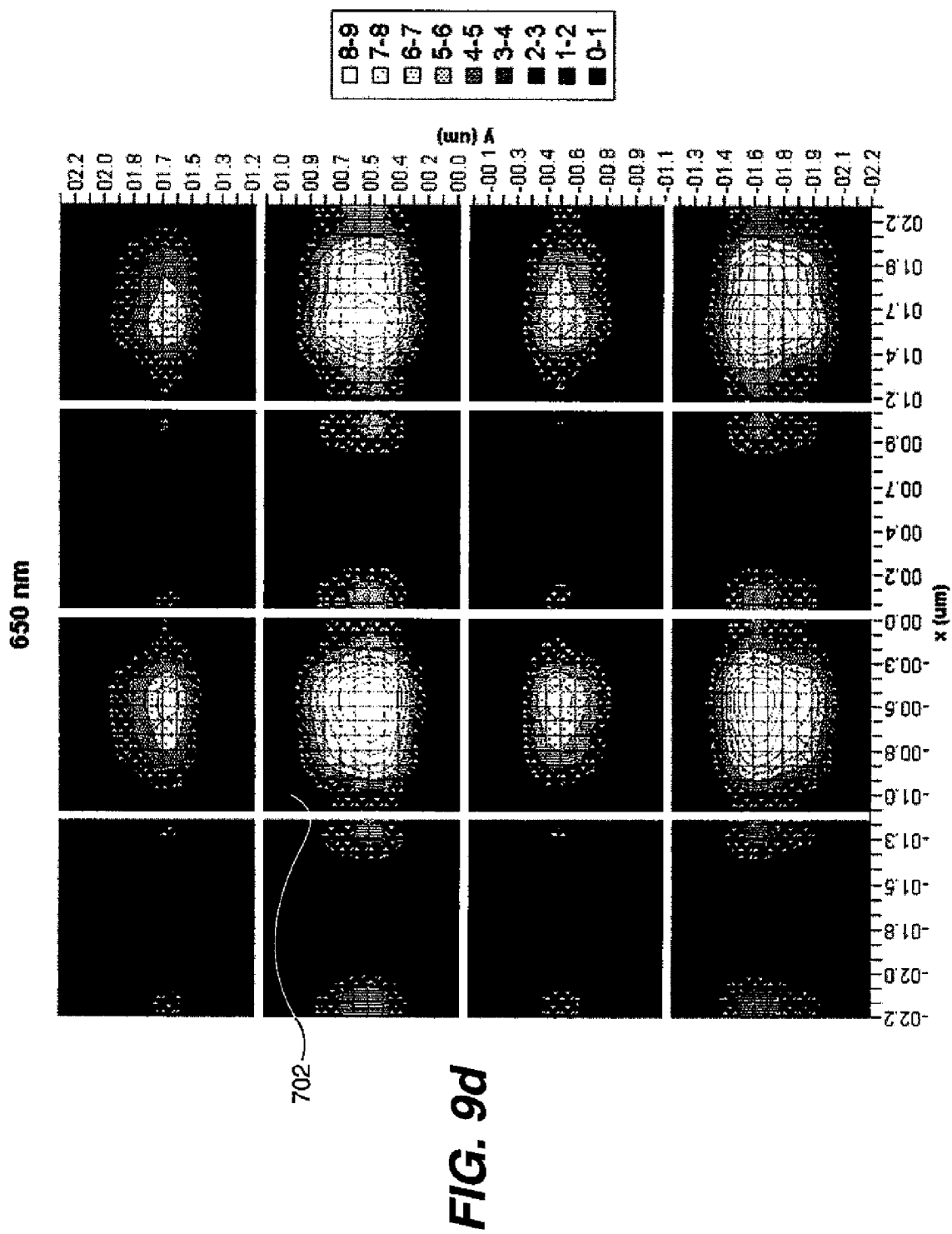

FIG. 8 shows simulation results for QE for a 1.1 μm pixel array using the first embodiment of the present invention as describe by FIGS. 5-7. The peak QE for the blue response curve 603 associated with the blue pixel 303 is 120%. The peak QE for the green/blue response curve 601 associated with the green/blue pixel 301 is 116%. The peak QE for the green/red response curve 604 associated with the green/red pixel 304 is 105%. The peak QE for the red response curve 604 associated with the red pixel 302 is 86%. The QE for a given wavelength can be greater than 100% for a given pixel because the optical paths are adjusted in such a way to take advantage of constructive and destructive interference.

FIGS. 9a-9d illustrate how constructive and destructive interference leads to QE curves with peaks greater than 100%. Shown are four plan view plots of the light intensity just above the silicon active layer 420 on the illuminated side for different wavelengths. For blue light (420 nm) most of the light intensity 703 is above pixel 303. Likewise, for green/blue light (470 nm) most of the light intensity 701 is above pixel 301. Likewise again, for green/red light (590 nm) most of the light intensity 704 is above pixel 304. Finally, for red light (650 nm) most of the light intensity 702 is above pixel 302.

Figure 10:
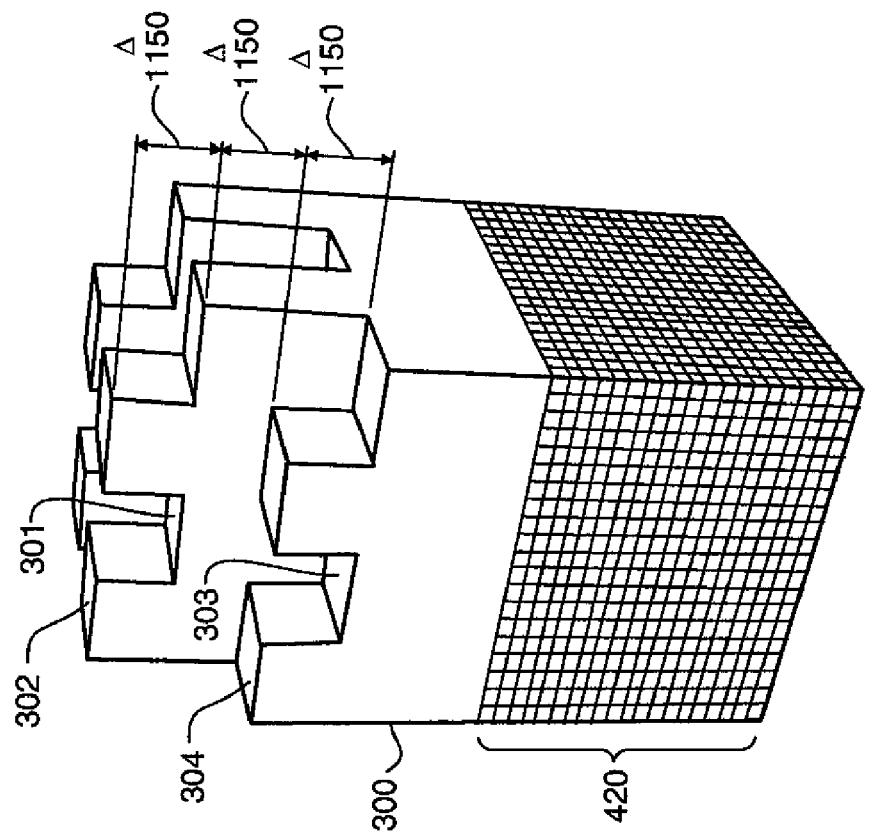
FIG. 10 illustrates the beginning of one method to fabricate the optical path grating. Shown are two cross-sections, each of four pixels. One cross-section is cut through pixels 303 and 304 of FIG. 7. The other cross-section is cut through pixels 301 and 303 of FIG. 7.
Figure 12A:
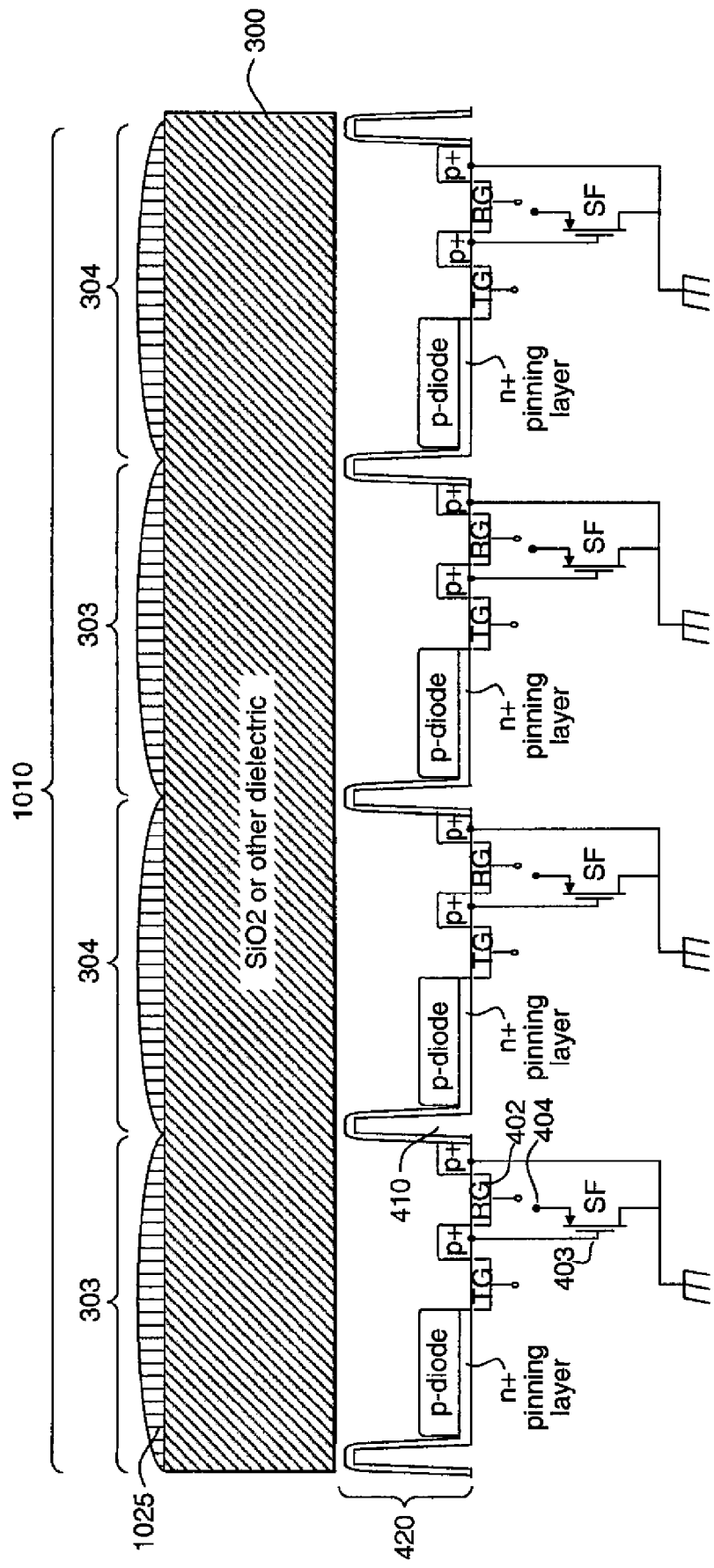
FIGS. 12a-12b illustrate a method of placing microlenses on the transparent layer.
Figure 12B:
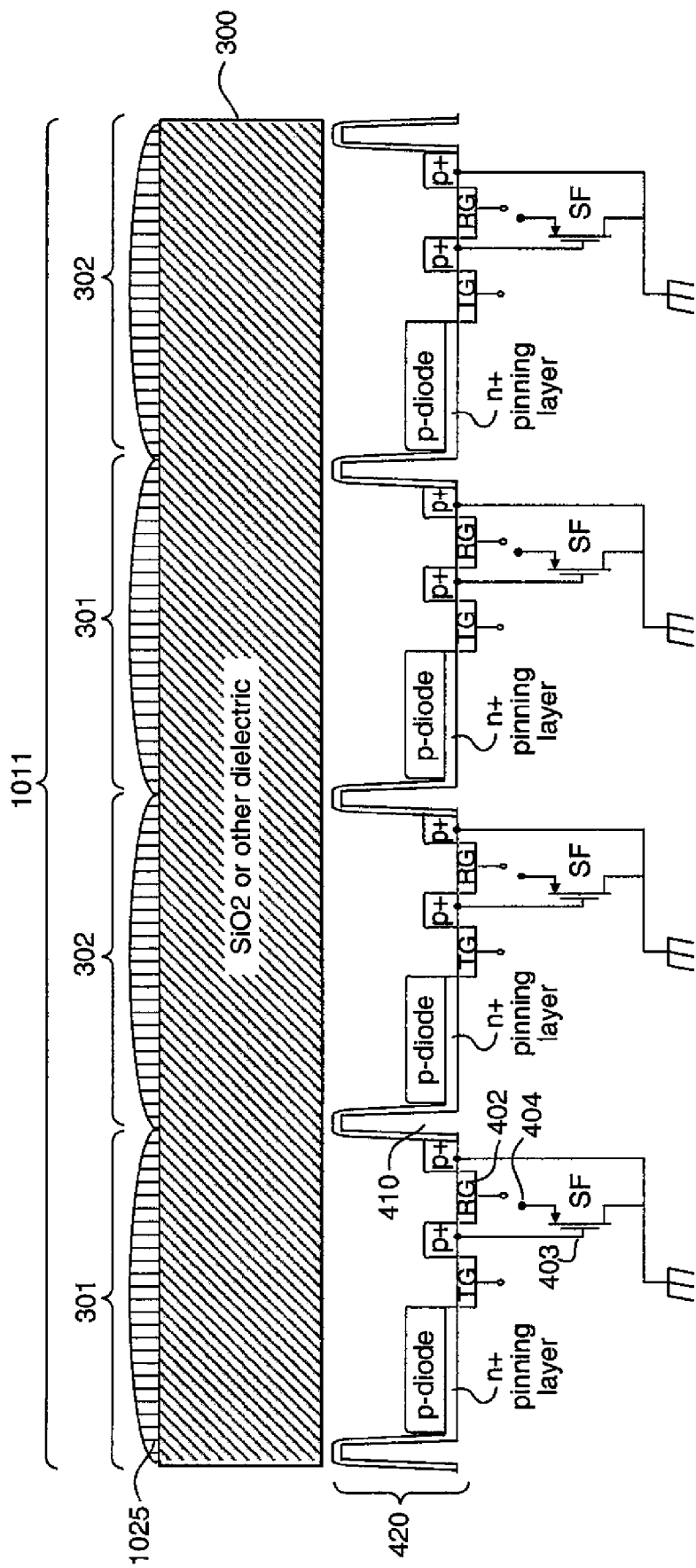

To help visualize the optical path grating, FIG. 10 shows a 4×4 pixel cutaway of FIGS. 5-7. Clearly visible is the optical stack 300 on top of the active layer 420. The four pixels (301, 302, 303, and 304) within a single color kernel are identified, along with the Δ height differences 1050 between the four transparent pillars.

As shown in FIG. 8, the peak QE for the blue, green/blue, green/red, and red response curves (603, 601, 604, and 602) are at wavelengths of 440 nm, 485 nm, 585 nm, and 645 nm respectively. This is for normal incidence. Unfortunately, tilting the angle of the incoming light away from normal incidence increases the optical path differences for the different pixels. This changes the details of the constructive and destructive interference and results in slight differences for the wavelength at which the QE is a peak for the different response curves. The differences in peak position increase further with increasing tilt angle. When this imager is placed into a camera system, the chief ray at the center of the pixel array is normal incidence, however, the chief ray angle for pixels near the edge of the array can exceed 30 degrees. Since the response curves depend on tilt angle, this leads to color shifts (hue shifts) across the image that are not always easy to correct.

There are several ways to minimize hue shifts associated with changes in tilt angle of the incident light. One method is to refine the binary optical path grating with more height differences, and optimize this refined system. This involves more etches to provide more possible heights in the transparent layer. This refinement also involves breaking the pixel into sub-pixel regions. For example, consider the case where there are eight possible heights and each pixel is broken up into sixteen-square subregions. With four pixels, this gives 512 degrees of freedom for the optical stack. Using numerical simulation, all cases can be modeled for a range of wavelengths, and the system optimized in such a way that there is good color separation for the four pixels, and the hue shifts are minimal. However, forcing the system to minimize the hue shift is the same as forcing the optical path above each pixel to be the same. The solution to this problem is something that looks like a microlens with a focal point just above the silicon surface. So instead of creating a microlens-like structure using binary optical techniques, it is easier to simply create a series of continuous microlenses.

Figure 11:
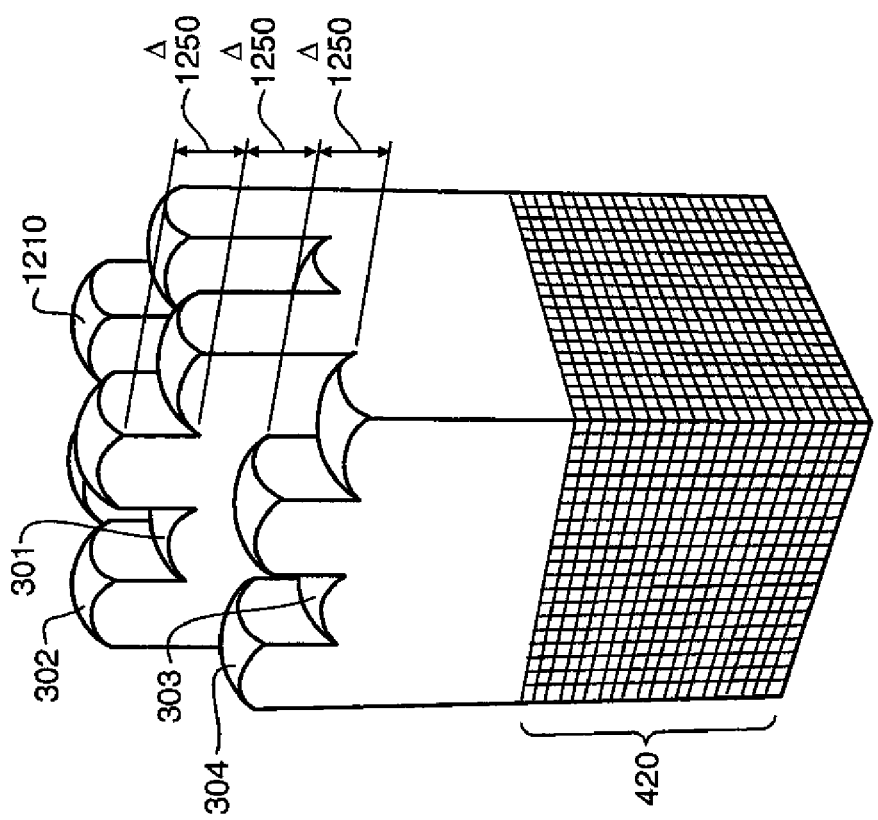
FIG. 11 is a 3D view of an optical path grating with microlenses.

FIG. 11 shows an optical path grating similar to the optical path grating of FIG. 11 where the optical path difference between pixels is Δ 1250 but there is also a microlens above each pixel 1210. This new structure will have better hue shift performance with changing tilt angle.

FIGS. 12-16 illustrate a method for fabricating an optical path grating with curved surfaces in the shape of a microlens as in FIG. 11. It is noted that FIGS. 12-16 describe Δ changes referenced by numerals not directly shown in FIGS. 12-16 but are shown in FIGS. 10, 11, 17 and/or 18. The following described procedure requires fewer lithography steps than that of a Bayer CFA. FIGS. 12a-12b illustrate two cross-sections of four pixels each, one through pixels 303 and 304 of the color kernel, the other through pixels 301 and 302 of the color kernel. Fabrication of the devices within the active layer 420 is complete, and the back illuminated imager thinned.

Silicon dioxide or some other transparent layer 300 of thickness greater than D has been grown or deposited on the illuminated side of the active layer 420. One top of the layer 300 is a patterned microlens array 1025. There are numbers of methods for fabricating this microlens array including microgap patterning and reflow and gray scale photolithography.

Figure 13A:
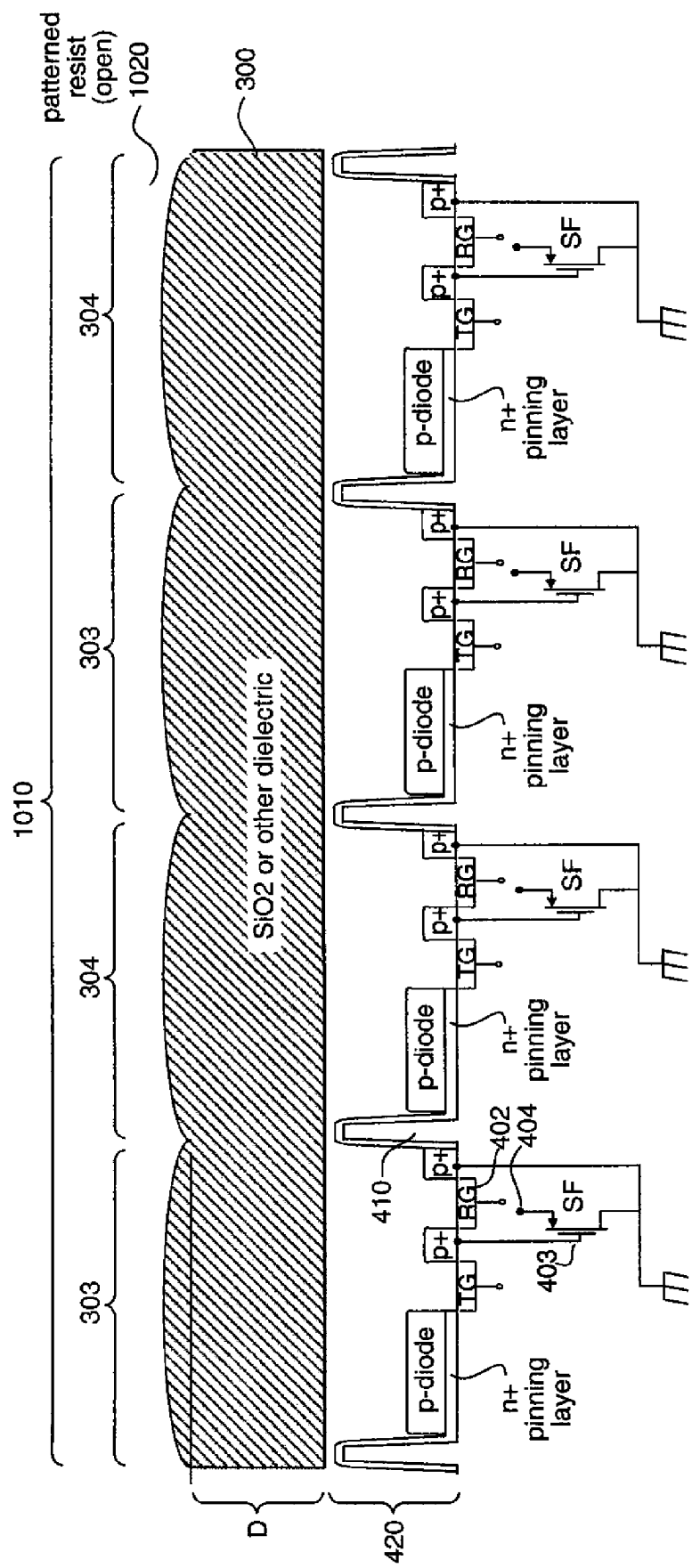
FIGS. 13a-13b illustrate a method of transferring the microlens pattern to the transparent layer.
Figure 13B:
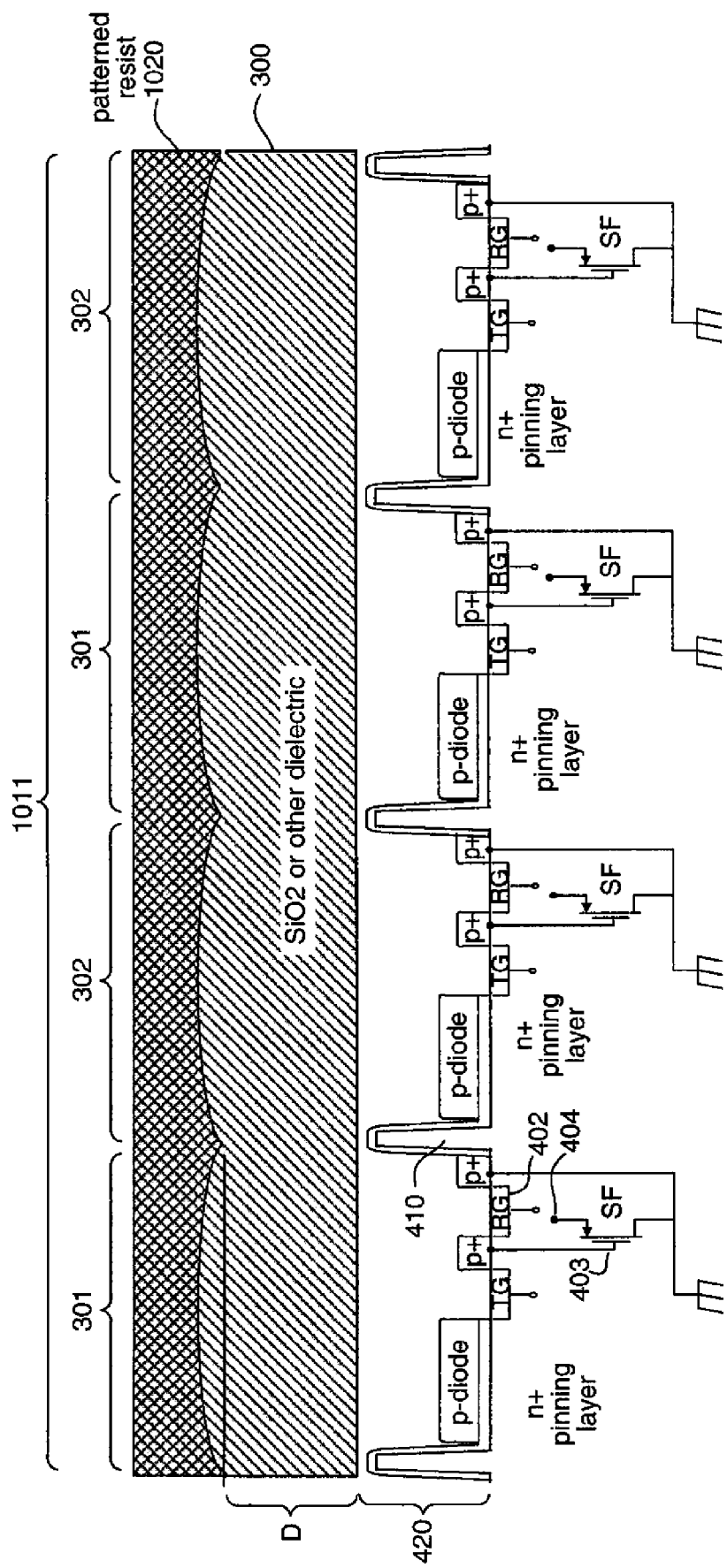

FIGS. 13a-13b illustrate the silicon dioxide layer 300 after a 1:1 directional etch that transfers the microlens surface into the transparent layer material. The thickness of layer 300 at the edge of the microlens is D. A resist layer 1020 is applied to a portion of the image array and patterned so that pixels 301 and 302 are covered with resist 1020, and the pattern leaves exposed the transparent layer 300 within pixels 303 and 304. The exposed transparent layer 300 is etched a thickness of 2Δ 1030.

Figure 14A:
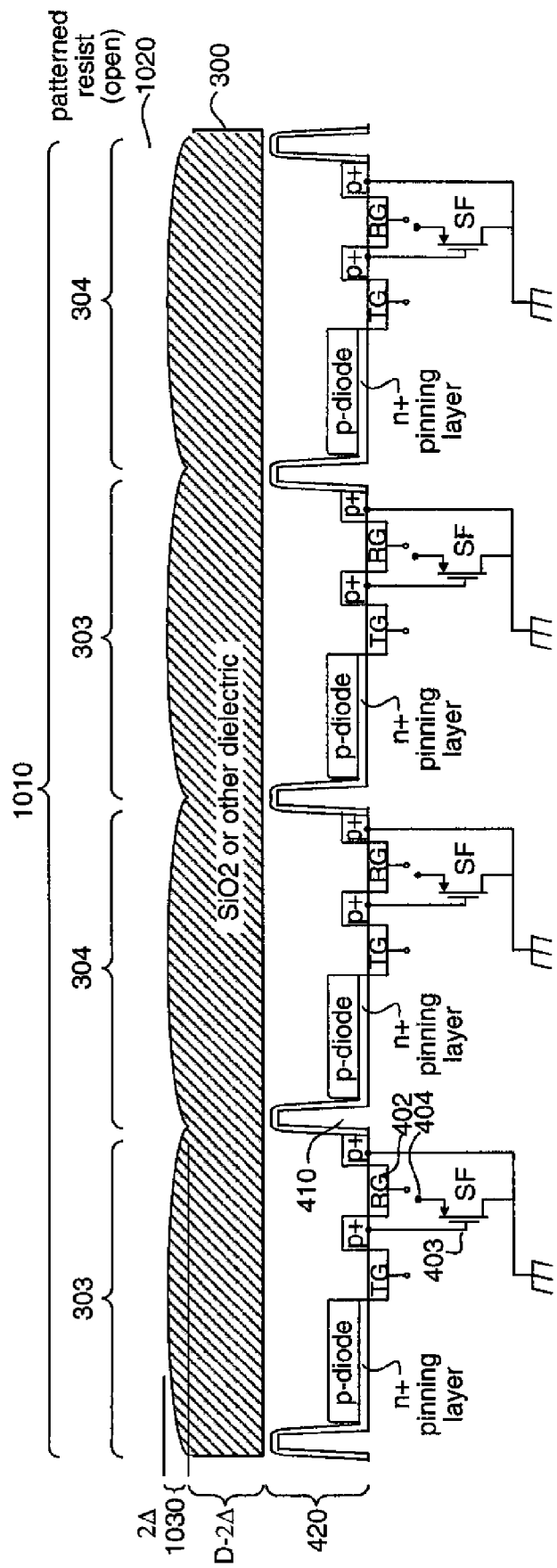
FIGS. 14a-14b illustrate a method for performing a first etch.
Figure 14B:
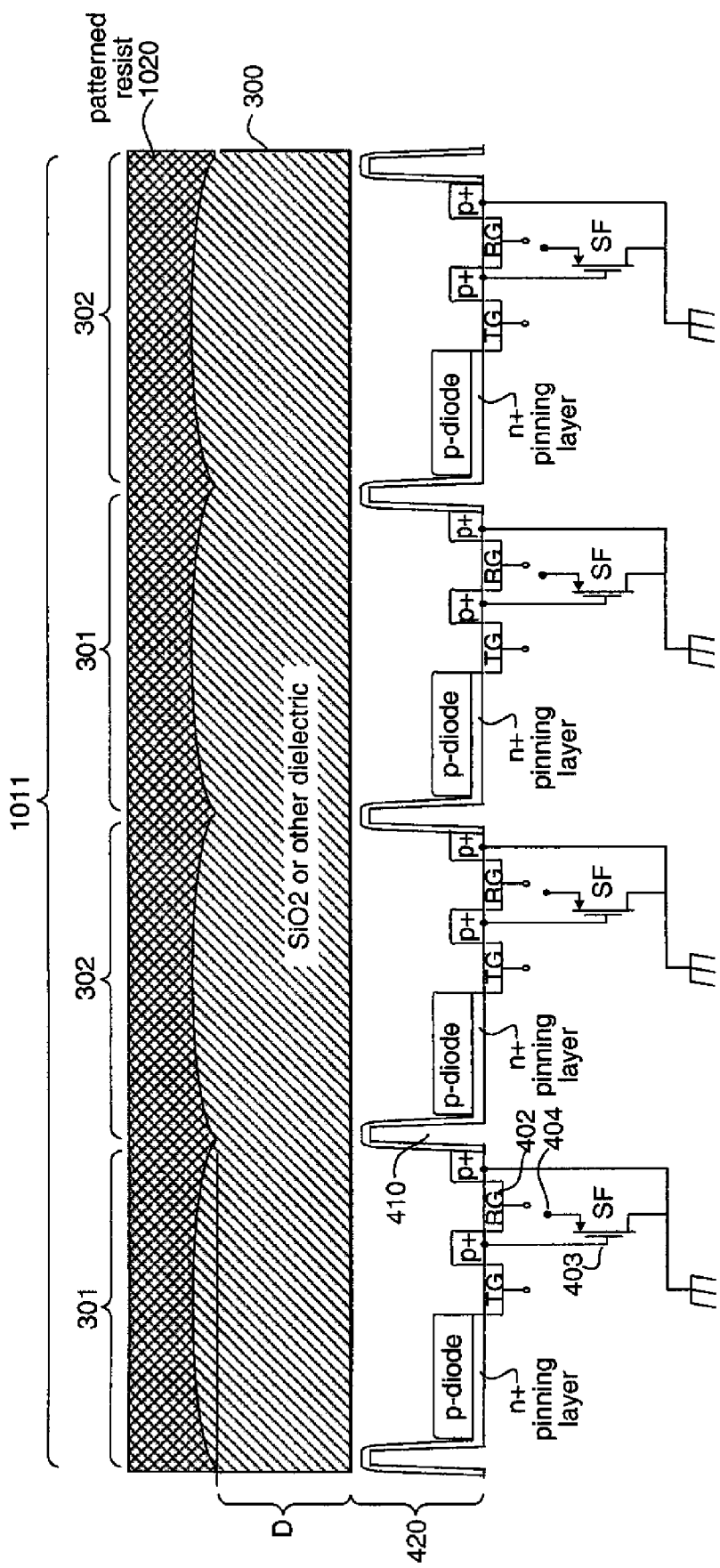

FIGS. 14a-14b show both cross-sections after a thickness of 2Δ 1030 of the transparent layer is etched and removed as discussed in the previous paragraph. The resist 1020 is then removed.

Figure 15A:
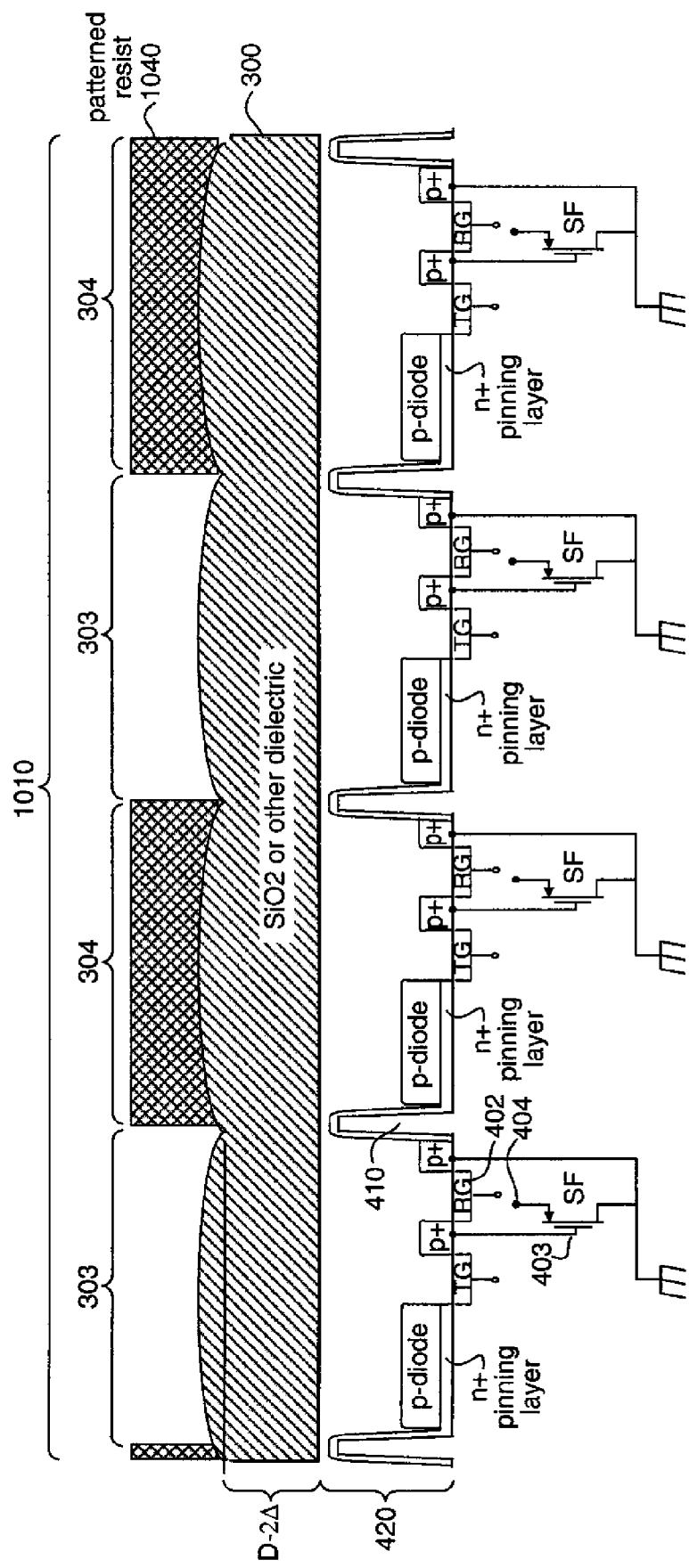
FIGS. 15a-15b illustrate a method of fabricating the optical path grating after the second resist is patterned.
Figure 15B:
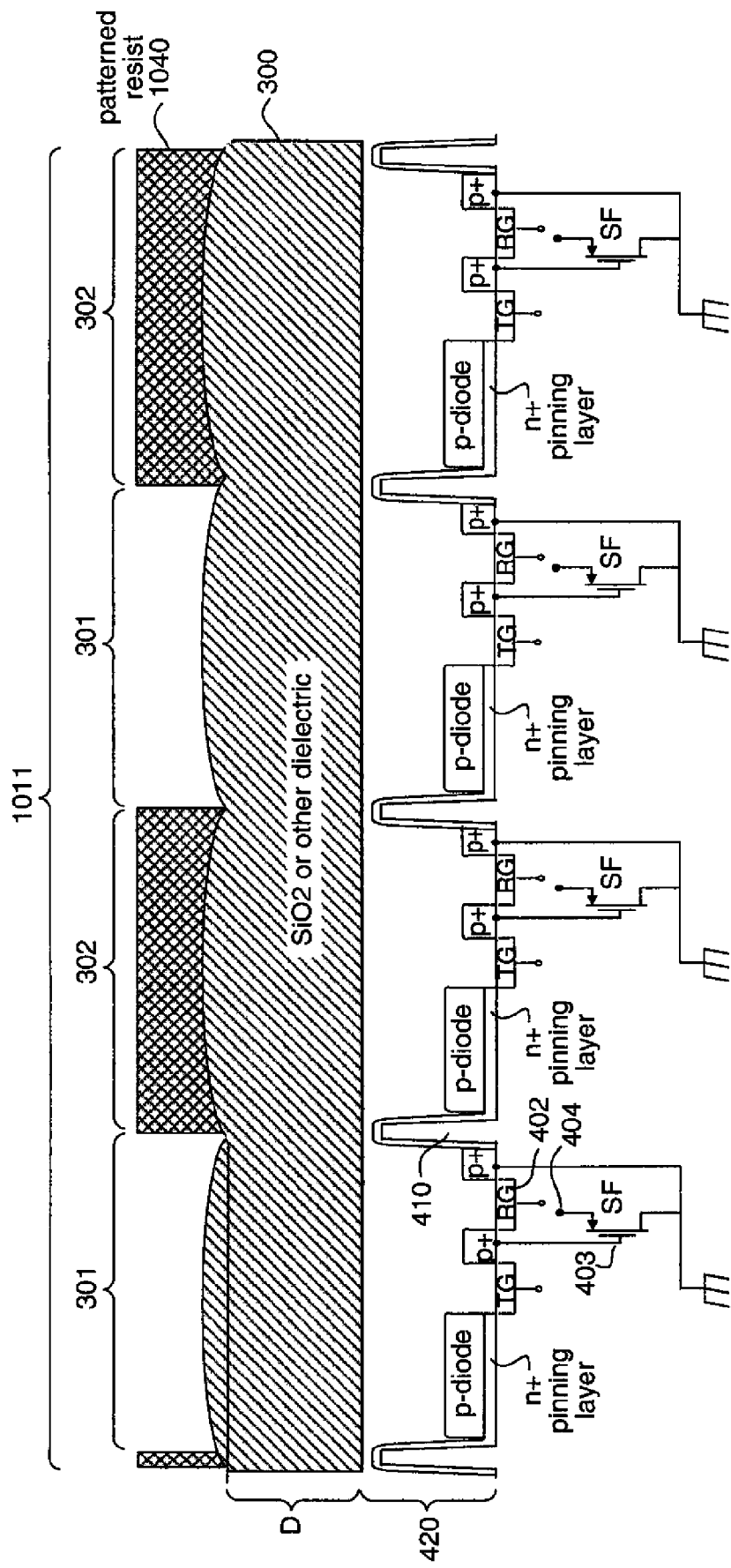

FIGS. 15a-15b illustrate the next step in the process after the patterned resist 1020 for the first etch is removed as discussed in the previous paragraph. A second resist layer 1040 is applied to the image array and patterned. This pattern exposes the transparent layer 300 within pixels 301, 303 and covers the transparent layer 300 within pixels 302 and 304. The exposed transparent layer 300 is etched and removed.

Figure 16A:
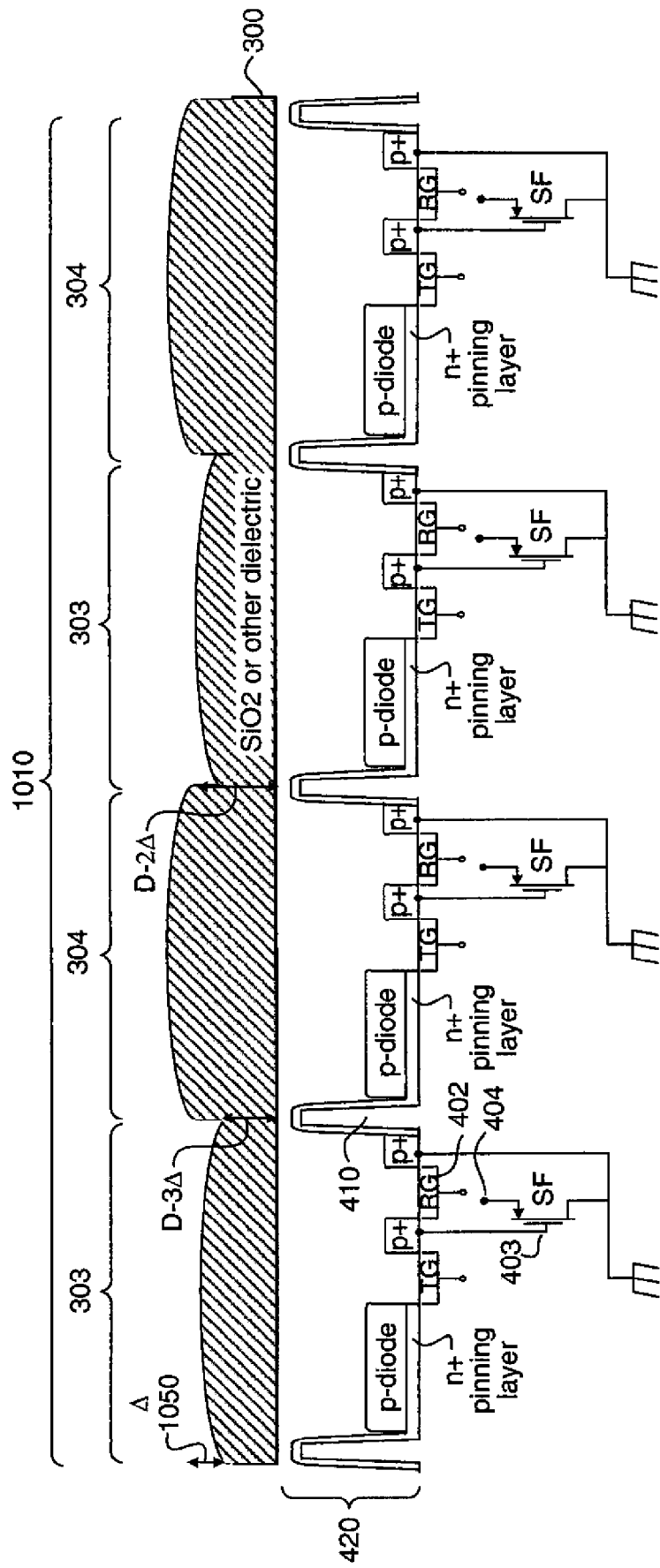
FIGS. 16a-16b illustrate the final optical path grating after the second etch step.
Figure 16B:
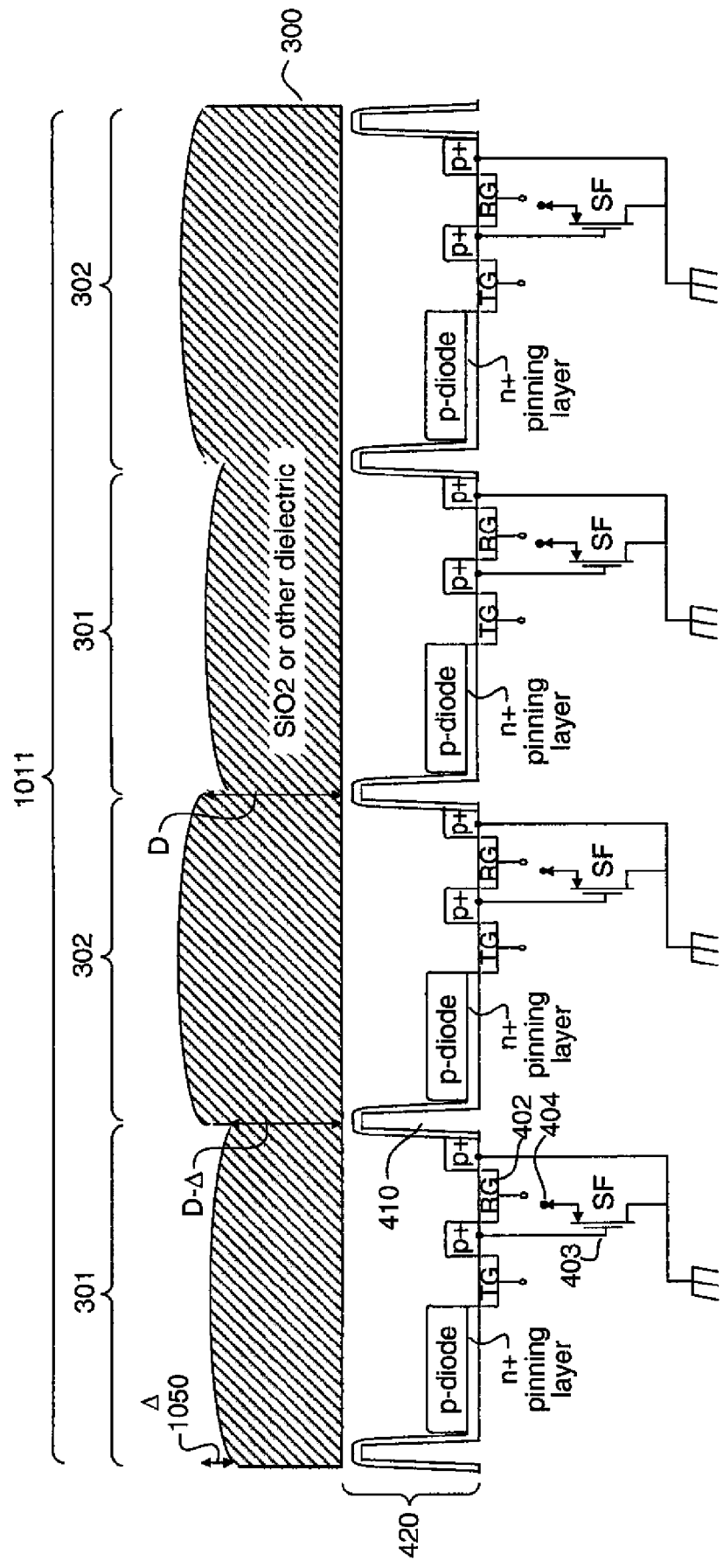
Figure 17:
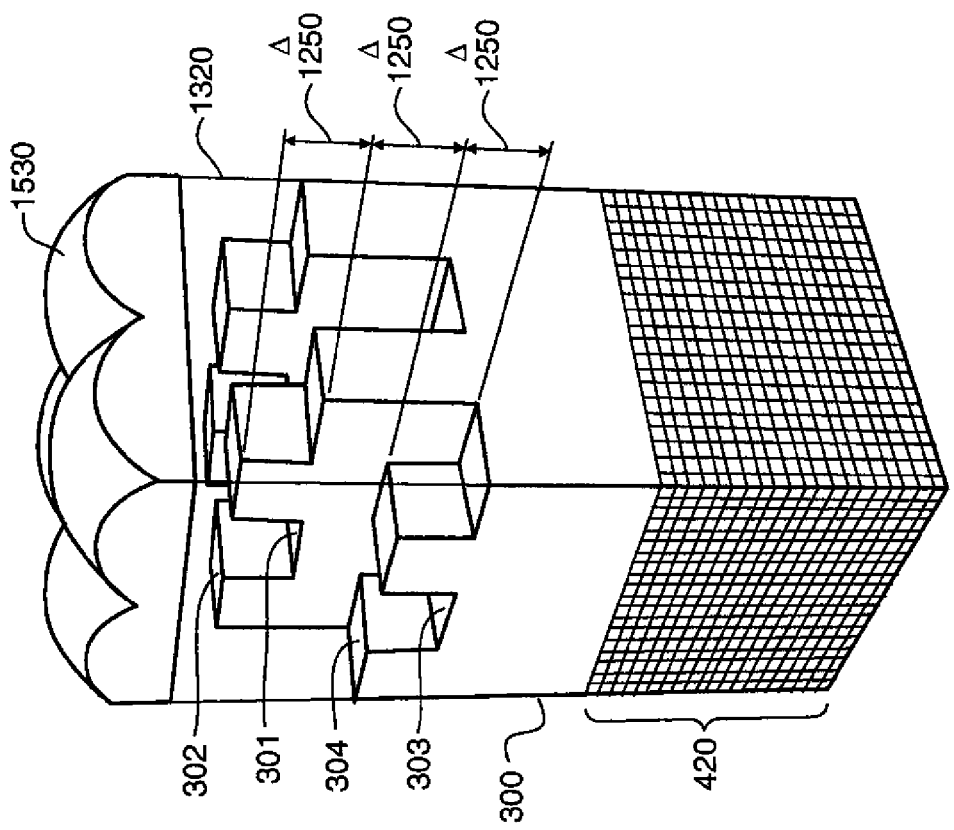
FIG. 17 is a 3D view of an optical path grating using two materials with different index of refraction and a microlens array.

FIGS. 16a-16b show both cross-sections after a thickness of Δ 1050 of the transparent layer is etched and removed as discussed in the preceding paragraph. The resist 1040 (of FIG. 15b) is removed. The final thicknesses of the transparent layer 300 are D, D-Δ, D-2Δ, and D-3Δ for pixels 302, 301, 304, and 303 respectively.

The optical path grating in FIG. 11 will have superior hue shift performance to the optical path grating in FIG. 10, however, for steeper and steeper angles, the highest pillar of transparent material (pixel 302) casts shadows on the shorter pillars (pixels 301, 304, and 303) since the material is not 100% transparent. This shadowing leads to hue shifts, the root cause of which is not variations in optical path length, but instead a reduction in light intensity over the shorter pixels.

FIG. 17 illustrates a way to minimize the hue shifts due to shadowing and optical path length differences. A second transparent material 1320 is inserted between the original optical path grating 300 and the microlens 1430. To maintain an optical path difference between the different pixels within the color kernel, the index of refraction of the two materials (300 and 1320) must be different. The microlens array 1430 is placed on top of the planer surface of layer 1320. The planar microlens array eliminates problems due to shadowing.

Figure 18:
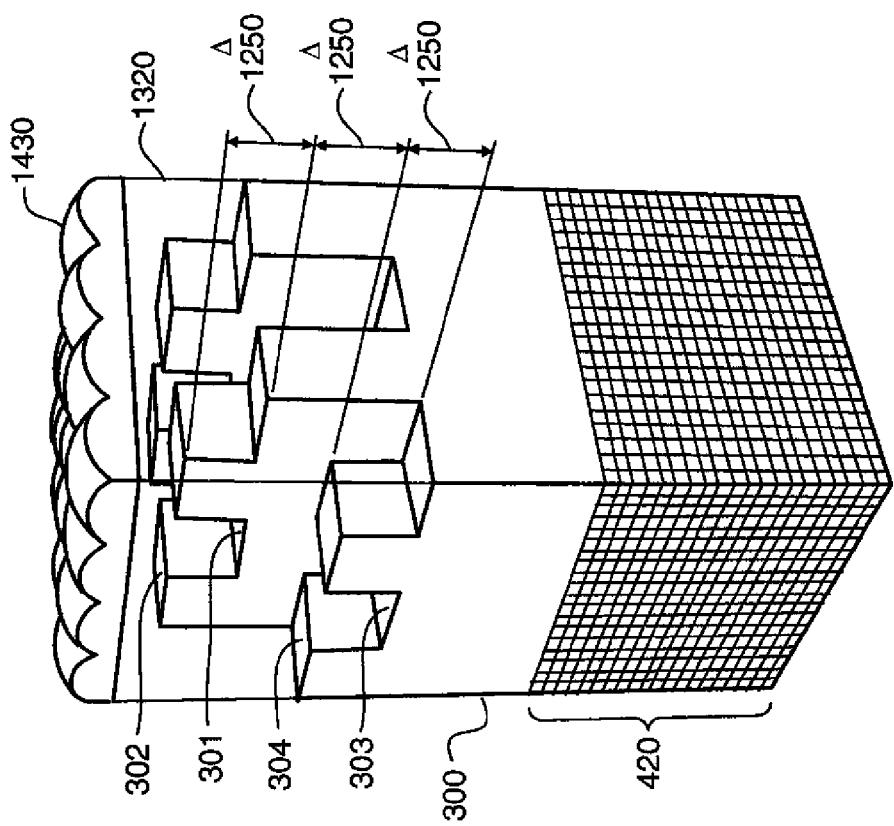
FIG. 18 is a 3D view of an optical path grating using two materials with different index of refraction and a microlens array where a single microlens is placed over four pixels.

Finally, FIG. 18 shows a structure similar to FIG. 17 except the size of the microlens 1530 equals the size of the color kernel and not the individual pixel (301, 302, 303, and 304). This has the advantage of focusing the light bundle from each microlens 1530 through each optical grating block (301, 302, 303, and 304) reducing hue shift even more.

Figure 19:
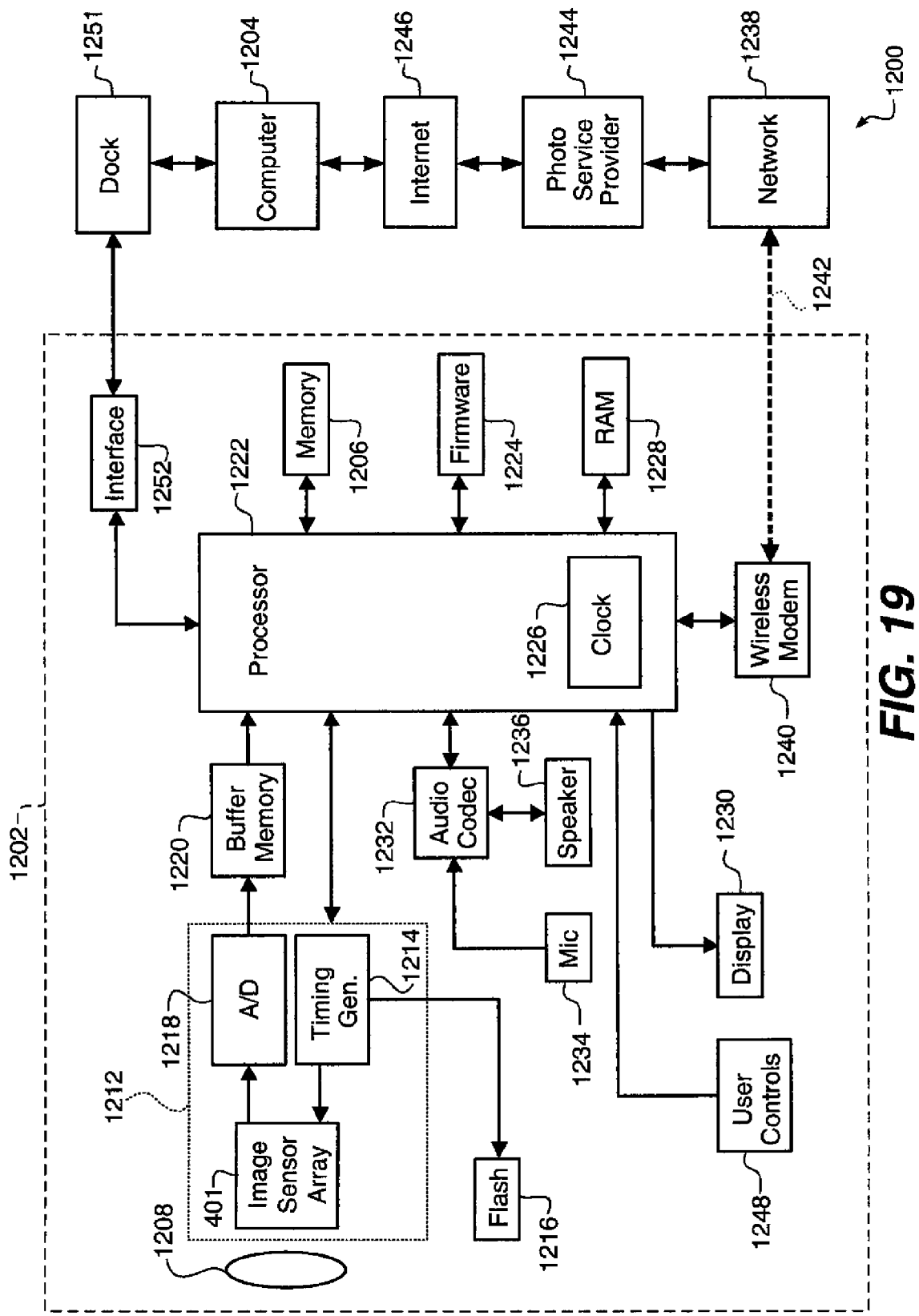
FIG. 19 is an imaging device having the image sensor array of FIG. 7.

FIG. 19 is a block diagram of an imaging system that can be used with the image sensor array 401 of present the invention. Imaging system 1200 includes digital camera phone 1202 and computing device 1204. Digital camera phone 1202 is an example of an image capture device that can use an image sensor incorporating the present invention. Other types of image capture devices can also be used with the present invention, such as, for example, digital still cameras and digital video camcorders.

Digital camera phone 1202 is a portable, handheld, battery-operated device in an embodiment in accordance with the invention. Digital camera phone 1202 produces digital images that are stored in memory 1206, which can be, for example, an internal Flash EPROM memory or a removable memory card. Other types of digital image storage media, such as magnetic hard drives, magnetic tape, or optical disks, can alternatively be used to implement memory 1206.

Digital camera phone 1202 uses lens 1208 to focus light from a scene (not shown) onto image sensor array 401 of active pixel sensor 1212. Image sensor array 401 provides color image information using the Bayer color filter pattern in an embodiment in accordance with the invention. Image sensor array 401 is controlled by timing generator 1214, which also controls flash 1216 in order to illuminate the scene when the ambient illumination is low.

The analog output signals output from the image sensor array 410 are amplified and converted to digital data by analog-to-digital (A/D) converter circuit 1218. The digital data are stored in buffer memory 1220 and subsequently processed by digital processor 1222. Digital processor 1222 is controlled by the firmware stored in firmware memory 1224, which can be flash EPROM memory. Digital processor 1222 includes real-time clock 1226, which keeps the date and time even when digital camera phone 1202 and digital processor 1222 are in a low power state. The processed digital image files are stored in memory 1206. Memory 1206 can also store other types of data, such as, for example, music files (e.g. MP3 files), ring tones, phone numbers, calendars, and to-do lists.

In one embodiment in accordance with the invention, digital camera phone 1202 captures still images. Digital processor 1222 performs color interpolation followed by color and tone correction, in order to produce rendered sRGB image data. The rendered sRGB image data are then compressed and stored as an image file in memory 1206. By way of example only, the image data can be compressed pursuant to the JPEG format, which uses the known "Exif" image format. This format includes an Exif application segment that stores particular image metadata using various TIFF tags. Separate TIFF tags can be used, for example, to store the date and time the picture was captured, the lens f/number and other camera settings, and to store image captions.

Digital processor 1222 produces different image sizes that are selected by the user in an embodiment in accordance with the invention. One such size is the low-resolution "thumbnail" size image. Generating thumbnail-size images is described in commonly assigned U.S. Pat. No. 5,164,831, entitled "Electronic Still Camera Providing Multi-Format Storage Of Full And Reduced Resolution Images" to Kuchta, et al. The thumbnail image is stored in RAM memory 1228 and supplied to display 1230, which can be, for example, an active matrix LCD or organic light emitting diode (OLED). Generating thumbnail size images allows the captured images to be reviewed quickly on color display 1230.

In another embodiment in accordance with the invention, digital camera phone 1202 also produces and stores video clips. A video clip is produced by summing multiple pixels of image sensor array 410 together (e.g. summing pixels of the same color within each 4 column×4 row area of the image sensor array 410) to create a lower resolution video image frame. The video image frames are read from image sensor array 410 at regular intervals, for example, using a 15 frame per second readout rate.

Audio codec 1232 is connected to digital processor 1222 and receives an audio signal from microphone (Mic) 1234. Audio codec 1232 also provides an audio signal to speaker 1236. These components are used both for telephone conversations and to record and playback an audio track, along with a video sequence or still image.

Speaker 1236 is also used to inform the user of an incoming phone call in an embodiment in accordance with the invention. This can be done using a standard ring tone stored in firmware memory 1224, or by using a custom ring-tone downloaded from mobile phone network 1238 and stored in memory 1206. In addition, a vibration device (not shown) can be used to provide a silent (e.g. non-audible) notification of an incoming phone call.

Digital processor 1222 is connected to wireless modem 1240, which enables digital camera phone 1202 to transmit and receive information via radio frequency (RF) channel 1242. Wireless modem 1240 communicates with mobile phone network 1238 using another RF link (not shown), such as a 3GSM network. Mobile phone network 1238 communicates with photo service provider 1244, which stores digital images uploaded from digital camera phone 1202. Other devices, including computing device 1204, access these images via the Internet 1246. Mobile phone network 1238 also connects to a standard telephone network (not shown) in order to provide normal telephone service in an embodiment in accordance with the invention.

A graphical user interface (not shown) is displayed on display 1230 and controlled by user controls 1248. User controls 1248 include dedicated push buttons (e.g. a telephone keypad) to dial a phone number, a control to set the mode (e.g. "phone" mode, "calendar" mode" "camera" mode), a joystick controller that includes 4-way control (up, down, left, right) and a push-button center "OK" or "select" switch, in embodiments in accordance with the invention.

Dock 1251 recharges the batteries (not shown) in digital camera phone 1202. Dock 1251 connects digital camera phone 1202 to computing device 1204 via dock interface 1252. Dock interface 1252 is implemented as wired interface, such as a USB interface, in an embodiment in accordance with the invention. Alternatively, in other embodiments in accordance with the invention, dock interface 1252 is implemented as a wireless interface, such as a Bluetooth or an IEEE 802.11b wireless interface. Dock interface 1252 is used to download images from memory 1206 to computing device 1204. Dock interface 1252 is also used to transfer calendar information from computing device 1204 to memory 1206 in digital camera phone 1202.

The invention has been described in detail with particular reference to certain preferred embodiments thereof, but it will be understood that variations and modifications can be effected within the spirit and scope of the invention. For example, the present invention also applies to front-side illuminate image sensors, and image sensors with other device structures, such as 3-transistor pixels, shared 4-transistor pixels, in addition to nmos devices.

PARTS LIST

100 Bayer CFA pattern
101 Green color filter
102 Red color filter
103 Blue color filter
104 Green color filter
105 Bayer color kernel
112 Effective aperture for red light
200 Photodiode implant
201 Transfer gate
202 Reset gate
203 Source/Follower transistor
204 Output
205 Floating diffusion
210 Sidewall isolation 211 N-doping layer
212 Pinning implant
213 Reset Drain
220 Active layer
221 Dielectric layer
222 Anti-reflection layer
230 CFA layer
250 Normal incident light
300 Transparent layer
301 Green/Blue pixel
302 Red pixel
303 Blue pixel
304 Green/Red pixel
310 Color kernel
350 Contacts
400 pinned photodiode
401 Image sensor array
401 Transfer gate
402 Red response curve
402 Reset gate
403 polysilicon gate
403 Blue response curve
403 Buffer
404 Source-follower output
404 metal wires
404 Implant region
404 Green response curve
405 Implant region
405 Conversion region
405 Floating diffusion
410 Sidewall isolation
412 Pinning layer
413 Implant region
413 Reset drain
420 Active layer
501 Green response curve
502 Red response curve
503 Blue response curve
504 Green response curve
601 Green/blue response curve
602 Red response curve
603 Blue response curve
604 Green/red response curve
701 Intensity peak region for 470 nm light
702 Intensity peak region for 650 nm light
703 Intensity peak region for 420 nm light
704 Intensity peak region for 590 nm light
1010 Cross-section through pixels 303 and 304
1011 Cross-section through pixels 301 and 302
1020 Patterned resist layer
1025 Patterned microlens array
1030 Etched amount of transparent layer
1040 Second patterned resist layer
1050 Etched amount of transparent layer
1200 Imaging system
1202 Imaging Device
1204 Computing device
1206 Memory
1208 Lens
1210 Microlens
1212 Active Pixel Sensor
1214 Timing Generator
1216 Flash
1218 Analog/digital converter
1220 Buffer Memory
1222 Processor
1224 Firmware
1226 Clock
1228 RAM
1230 Display
1232 Audio Codec
1234 Microphone
1236 Speaker
1238 Network
1240 Wireless Modem
1242 Connection
1244 Service provider
1246 Internet
1248 User Controls
1250 Difference in transparent layer thickness between pixels
1251 Dock
1252 Interface
1320 Second transparent material layer
1430 Microlens
1530 Microlens

The invention claimed is:

1. An image sensor comprising:
    (a) an array of pixels comprising a plurality of kernels that repeat periodically and each kernel includes n charge collection regions for collecting charge in response to light, n is equal to or greater than 2, wherein the charge collection regions are disposed in an active layer;
    (b) a transparent layer immediately on top of the active layer and spanning the charge collection regions having n optical paths for each kernel, at least two of which are different, wherein each optical path directs light of a single spectra band of different wavelengths to one or more predetermined adjacent charge collection regions; and
    wherein each charge collection region receives a spectral band of light containing a peak wave length corresponding to a single color, which is directed toward one optical path, and wherein the peak wavelength received by each of the adjacent charge collection regions is different, such that each charge collection region receives light having a peak wavelength corresponding to a single color.

2. The image sensor as in claim 1, wherein differences in the optical paths are created by different thicknesses of the transparent material.

3. The image sensor as in claim 2, wherein the transparent material includes a curved surface.

4. The image sensor as in claim 1, wherein differences in the optical paths are created by different index of refractions.

5. The image sensor as in claim 4, wherein the transparent layer is either silicon dioxide, silicon nitride, or a transparent organic material.

6. The image sensor of claim 1, wherein the optical paths are different from each other.

7. The image sensor as in claim 1 further comprising a second layer disposed spanning the transparent layer, and the second layer includes a planar or substantially planar surface on a surface opposite a surface of the second layer contacting the transparent layer.

8. The image sensor as in claim 7 further comprising a plurality of microlenses disposed spanning the second layer.

9. The image sensor as in claim 8, wherein each microlens spans an individual pixel.

10. The image sensor as in claim 8, wherein each microlens spans a kernel of pixels.

11. An imaging device comprising:
    an image sensor comprising:
    (a) an array of pixels comprising a plurality of kernels that repeat periodically and each kernel includes n charge collection regions for collecting charge in response to light, n is equal to or greater than 2, wherein the charge collection regions are disposed in an active layer; and (b) a transparent layer immediately on top of the active layer and spanning the charge collection regions having n optical paths for each kernel, at least two of which are different, wherein each optical path directs light of a single spectra band of different wavelengths to one or more predetermined adjacent charge collection regions; and wherein each charge collection region receives a spectral band of light containing a peak wave length corresponding to a single color, which is directed toward one optical path, and wherein the peak wavelength received by each of the adjacent charge collection regions is different, such that each charge collection region receives light having a peak wavelength corresponding to a single color.

12. The imaging device as in claim 11, wherein differences in the optical paths are created by different thicknesses of the transparent material.

13. The imaging device sensor as in claim 12, wherein the transparent material includes a curved surface.

14. The imaging device as in claim 11, wherein differences in the optical paths are created by different index of refractions.

15. The imaging device as in claim 14, wherein the transparent layer is either silicon dioxide, silicon nitride, or a transparent organic material.

16. The imaging device as in claim 11, wherein the optical paths are different from each other.

17. The imaging device as in claim 11 further comprising a second layer disposed spanning the transparent layer, and the second layer includes a planar or substantially planar surface on a surface opposite a surface of the second layer contacting the transparent layer.

18. The imaging device as in claim 17 further comprising a plurality of microlenses disposed spanning the second layer.

19. The imaging device as in claim 18, wherein each microlens spans an individual pixel.

20. The imaging device as in claim 18, wherein each microlens spans a kernel of pixels.

* * * * *